(12) United States Patent
Ko et al.

(10) Patent No.: US 9,979,363 B2
(45) Date of Patent: May 22, 2018

(54) SOURCE DRIVER INCLUDING OUTPUT BUFFER, DISPLAY DRIVING CIRCUIT, AND OPERATING METHOD OF SOURCE DRIVER

(71) Applicant: SAMSUNG ELECTRONICS CO., LTD., Suwon-si (KR)

(72) Inventors: Ju-Hyun Ko, Yongin-si (KR); Yong-joo Song, Hwaseong-si (KR); Jun-ho Song, Seoul (KR); Jin-chul Choi, Goyang-si (KR); Beop-hee Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 37 days.

(21) Appl. No.: 15/171,080

(22) Filed: Jun. 2, 2016

(65) Prior Publication Data

US 2017/0032740 A1 Feb. 2, 2017

(30) Foreign Application Priority Data

Jul. 30, 2015 (KR) .................. 10-2015-0108147

(51) Int. Cl.
*H03F 3/45* (2006.01)
*G09G 3/20* (2006.01)
*H03F 3/30* (2006.01)

(52) U.S. Cl.
CPC ....... *H03F 3/45273* (2013.01); *G09G 3/2092* (2013.01); *H03F 3/3022* (2013.01); *H03F 3/45219* (2013.01); *H03F 3/45475* (2013.01); *G09G 2310/0248* (2013.01); *G09G 2310/0254* (2013.01); *G09G 2310/0291* (2013.01); *G09G 2310/08* (2013.01); *G09G 2330/021* (2013.01); *H03F 2203/45112* (2013.01); *H03F 2203/45726* (2013.01)

(58) Field of Classification Search
None
See application file for complete search history.

(56) References Cited

U.S. PATENT DOCUMENTS 7,859,505 B2 12/2010 An
7,884,653 B2 2/2011 Chen et al.
7,911,437 B1 3/2011 Bell
(Continued)

FOREIGN PATENT DOCUMENTS

KR 10-2012-0074053 A 7/2012

*Primary Examiner* — Christopher Kohlman
(74) *Attorney, Agent, or Firm* — Sughrue Mion, PLLC

(57) ABSTRACT

A source driver includes a buffer device including a plurality of buffers corresponding to a plurality of data lines, each of the plurality of buffers respectively including an amplifier configured to amplify an input signal and an output driver configured to output a driving signal to a corresponding data line among the plurality of data lines; and a switch device including a charge sharing switch configured to electrically connect the plurality of data lines to one another during a charge sharing operation, each of the amplifiers including a first current mirror having a reference current path including a first node and an output current path including a second node, and the first node of the reference current path and the second node of the output current path are electrically connected to each other during the charge sharing operation.

19 Claims, 19 Drawing Sheets

(56) References Cited

U.S. PATENT DOCUMENTS

| | | | |
|---|---|---|---|
| 8,599,179 B2 | 12/2013 | Kim et al. | |
| 8,638,164 B2 | 1/2014 | Son et al. | |
| 2006/0125759 A1* | 6/2006 | An | G09G 3/3688 345/98 |
| 2010/0149171 A1 | 6/2010 | Huang et al. | |
| 2011/0018853 A1 | 1/2011 | Kawagoshi | |
| 2011/0169808 A1* | 7/2011 | Son | G09G 3/20 345/211 |
| 2011/0310080 A1 | 12/2011 | Tonomura | |
| 2012/0133632 A1 | 5/2012 | Hsu | |
| 2014/0320464 A1 | 10/2014 | Ryu et al. | |
| 2015/0256011 A1* | 9/2015 | Shi | G01R 31/3606 429/61 |

\* cited by examiner

SOURCE DRIVER INCLUDING OUTPUT BUFFER, DISPLAY DRIVING CIRCUIT, AND OPERATING METHOD OF SOURCE DRIVER

CROSS-REFERENCE TO RELATED APPLICATION

This application claims priority from Korean Patent Application No. 10-2015-0108147, filed on Jul. 30, 2015, in the Korean Intellectual Property Office, the disclosure of which is incorporated herein in its entirety by reference.

BACKGROUND

1. Field

The exemplary embodiments disclosed herein relate to a source driver, and more particularly, to a source driver including an output buffer, a display driving circuit, and an operating method of the source driver.

2. Description of the Related Art

Flat panel displays are widely used in smartphones, laptop computers, monitors, and other electronic devices. For example, liquid crystal display (LCD), an organic electroluminance display, and other types of displays are generally used as flat panel displays. Flat panel displays include a panel for realizing an image, and a plurality of pixels are disposed on the panel. The image is realized on the panel, as the pixels are driven according to a data signal provided by a display driver integrated circuit (IC).

In order to prevent deterioration of the pixels, a technology to drive a data line by a polarity reversal method has been proposed. The polarity reversal method may include, for example, a frame reversal method that reverses polarities in a frame unit, a line reversal method that reverses polarities in a line unit, and a dot inversion method that reverses polarities in a pixel unit. Along with this polarity reversal method, a charge sharing function which shares charges of data lines has been used to reduce power consumption and improve visibility.

In the charge sharing operation, a buffer output has to be prevented from being provided to data lines and the plurality of data lines have to be electrically connected, and thus, a plurality of switches have to be further included in the display driver IC. Such an increase in the number of switches may raise manufacturing costs and may increase a die area. Therefore, an efficient design of the display driver IC is required.

SUMMARY

The exemplary embodiments provide a source driver, a display driving circuit, and an operating method of the source driver, which have efficient designs and thereby reduce manufacturing costs and sizes.

According to an aspect of an exemplary embodiment, there is provided a source driver including: a buffer device including a plurality of buffers corresponding to a plurality of data lines, wherein each of the plurality of buffers respectively comprises an amplifier configured to amplify an input signal and an output driver configured to output a driving signal to a corresponding data line among the plurality of data lines; and a switch device comprising a charge sharing switch configured to electrically connect the plurality of data lines to one another during a charge sharing operation, wherein the amplifier comprises a first current mirror having a reference current path comprising a first node and an output current path comprising a second node, and the first node of the reference current path and the second node of the output current path are electrically connected to each other during the charge sharing operation.

The amplifier may further include a first switch connected between the first node and the second node, and the first switch may be turned on during the charge sharing operation.

The source driver may further include a control logic configured to generate a first control signal for disabling the output driver and a second control signal configured to turn on the first switch during the charge sharing operation.

The output driver may be disabled during the charge sharing operation.

The plurality of buffers may be provided in a path which negatively feeds back the driving signal from an output end to an input end of the plurality of buffers.

Voltage levels of the first node and voltage levels of the second node during the charge sharing operation may correspond to voltage levels of the plurality of buffers during a normal state.

The amplifier may further include a second current mirror having a reference current path comprising a third node and an output current path comprising a fourth node, and in the second current mirror, the third node of the reference current path and the fourth node of the output current path may be electrically connected to each other during the charge sharing operation.

The amplifier may further include a bias device, the reference current path may include a first transistor including a first gate and a second transistor including a second gate, the first transistor and the second transistor may be connected in series to each other between a first voltage and the bias device, the output current path may include a third transistor including a third gate and a fourth transistor including a fourth gate, the third transistor and the fourth transistor may be connected in series to each other between the first voltage and the bias device, and the first gate of the first transistor may be connected to the third gate of the third transistor, and the second gate of the second transistor may be connected to the fourth gate of the fourth transistor.

The first node may be provided between the first transistor and the second transistor, and the second node may be provided between the third transistor and the fourth transistor.

The first node may be provided between the second transistor and the bias device, and the second node may be provided between the fourth transistor and the bias device.

The first node may be provided between the first transistor and the second transistor or between the second transistor and the bias device, and the second node may be provided between the third transistor and the fourth transistor or between the fourth transistor and the bias device.

According to another aspect of an exemplary embodiment, there is provided a source driver including: a plurality of buffers, each of the buffers respectively including an amplifier configured to amplify an input signal and an output driver configured to output a driving signal to a data line, wherein the amplifier includes a bias device configured to receive a bias voltage and a first current mirror connected between a first voltage and the bias device, and the first current mirror includes: a first transistor and a second transistor forming a first reference current path and connected in series to each other between the first voltage and the bias device, a third transistor and a fourth transistor forming a first output current path and connected in series to each other between the first voltage and the bias device, and a first switch electrically connecting the first reference current path to the first output current path.

The first reference current path may include: a first node provided between the first transistor and the second transistor, and a second node provided between the second transistor and the bias device, and the first output current path may include a third node provided between the third transistor and the fourth transistor and a fourth node provided between the fourth transistor and the bias device.

The switch may include a first electrode connected to the first node or the second node, and may further include a second electrode connected to the third node or the fourth node.

The first current mirror may further include a second switch electrically connecting the first reference current path to the first output current path, the first switch may be connected between one of the first node and the second node and one of the third node and the fourth node, and the second switch may be connected between the other of the first node and the second node and the other of the third node and the fourth node.

The amplifier may further include a second current mirror connected between a second voltage and the bias device, and the second current mirror may include: a fifth transistor and a sixth transistor forming a second reference current path and connected in series to each other between the second voltage and the bias device, a seventh transistor and an eighth transistor forming a second output current path and connected in series to each other between the second voltage and the bias device, and a second switch electrically connecting the second reference current path to the second output current path.

The first voltage may be a power voltage and the second voltage may be a ground voltage.

The second reference current path may include a fifth node provided between the fifth transistor and the sixth transistor and a sixth node provided between the sixth transistor and the bias device, and the second output current path may include a seventh node provided between the seventh transistor and the eighth transistor and an eighth node provided between the eighth transistor and the bias device.

The output driver may include: a first driving transistor including a gate connected to the fourth node, a second driving transistor including a gate connected to the eighth node, a first compensation capacitor including an electrode connected to the third node; a second compensation capacitor including an electrode connected to the seventh node, a first enable switch connected between the fourth node and the gate of the first driving transistor, and a second enable switch connected between the eighth node and the gate of the second driving transistor.

According to an aspect of another exemplary embodiment, there is provided an output buffer of a source driver having a feedback path, the output buffer including: an inputter configured to receive a gradation voltage and a feedback voltage as input signals; an amplifier configured to perform an amplification operation based on the input signals and thereby generate an output signal, the amplifier including a first current mirror connected to a first voltage, a second current mirror connected to a second voltage, and a bias device connected between the first current mirror and the second current mirror, the first current mirror including at least two nodes provided inside the first current mirror; and an output driver configured to generate a driving signal for driving a data line, based on an output signal of the amplifier, wherein the first current mirror includes a first switch configured to electrically connect the at least two nodes provided inside the first current mirror to each other during a charge sharing operation.

The second current mirror may include: at least two nodes provided inside the second current mirror; and a second switch configured to electrically connect the at least two nodes provided inside the second current mirror to each other during the charge sharing operation.

The first current mirror may include a first reference current path including a first node and a first output current path including a second node, and the second current mirror may include a second reference current path including a third node and a second output current path including a fourth node, and the first switch may be connected between the first node of the first reference current path and the second node of the first output current path, and the second switch may be connected between the third node of the second reference current path and the fourth node of the second output current path.

During the charge sharing operation, the output driver may be disabled, which breaks the feedback path, and the first switch may be turned on, and voltage levels of at least two nodes connected to the first switch may become the same.

According to an aspect of another exemplary embodiment, an operating method of a source driver including a buffer configured to drive a plurality of data lines includes: electrically connecting the plurality of data lines to one another, in response to initiating a charge sharing operation; disabling an output driver of the buffer; electrically connecting a first node of a reference current path of a current mirror provided in the buffer to a second node of an output current path of the current mirror; and breaking the electrical connection between the first node and the second node in response to ending the charge sharing operation.

The electrically connecting the first node of the reference current path of the current mirror provided in the buffer to the second node of the output current path of the current mirror may include turning on a switch connected between the first node and the second node during the charge sharing operation.

BRIEF DESCRIPTION OF THE DRAWINGS

Exemplary embodiments will be more clearly understood from the following detailed description taken in conjunction with the accompanying drawings in which.

DETAILED DESCRIPTION OF THE EXEMPLARY EMBODIMENTS

Figure 1:
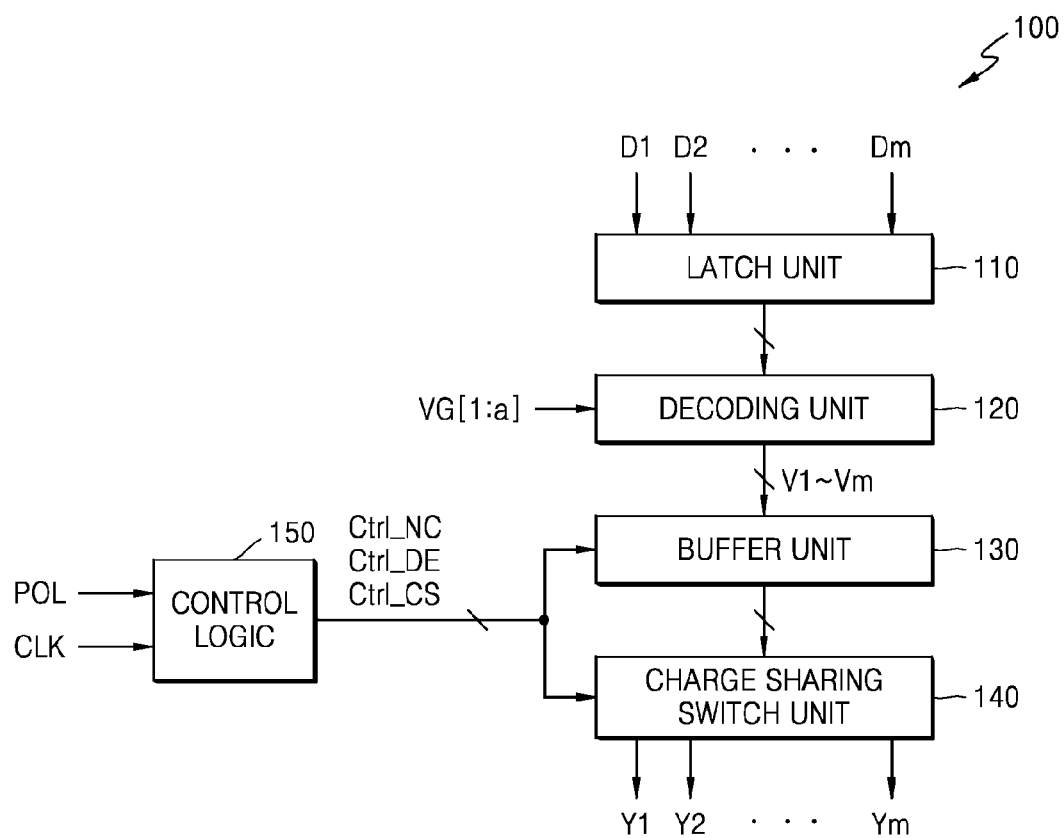
FIG. 1 is a block diagram of a source driver according to an exemplary embodiment.

Hereinafter, the exemplary embodiments will now be described more fully with reference to the accompanying drawings, in which exemplary embodiments are shown. Like reference numerals in the drawings denote like elements, and a repeated explanation of overlapping features may be omitted. Expressions such as "at least one of," when preceding a list of elements, modify the entire list of elements and do not modify the individual elements of the list. These exemplary embodiments may, however, be embodied in different forms and should not be construed as limited to the exemplary embodiments set forth herein. Rather, these exemplary embodiments are provided so that this disclosure is thorough and complete and fully conveys the exemplary embodiments to those skilled in the art. It should be understood that exemplary embodiments cover all modifications, equivalents, and alternatives falling within the spirit and scope of the exemplary embodiments. In the attached drawings, sizes of structures may be exaggerated for clarity.

The terminology used herein is for describing particular exemplary embodiments and is not intended to be limiting of exemplary embodiments. As used herein, the singular forms "a," "an," and "the," are intended to include the plural forms as well, unless the context clearly displays otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meanings as commonly understood in the art to which the exemplary embodiments belong. It will be further understood that the terms such as those defined in commonly used dictionaries should be interpreted as having meanings consistent with their meanings in the context of the relevant art and will not be interpreted in an idealized or overly formal sense unless expressly so defined herein.

FIG. 1 is a block diagram of a source driver 100 according to an exemplary embodiment.

As illustrated in FIG. 1, the source driver 100 may include a latch unit 110 (e.g., latch), a decoding unit 120 (e.g., decoder), a buffer unit 130 (e.g., buffer device), and a charge sharing switch unit 140 (e.g., charge sharing switch device). Also, the source driver 100 may further include a control logic 150 for generating control signals for controlling various switches provided in the buffer unit 130 and the charge sharing switch unit 140. The source driver 100 may be realized as a single semiconductor chip. Alternatively, the function of the source driver 100 may be realized by a semiconductor device, such as a system-on-chip.

The source driver 100 may include m channels corresponding to a plurality of (for example, m) data lines, and may output as driving signals data signals Y1 through Ym for driving the plurality of data lines, via the m channels. The data signals Y1 through Ym may be provided to m pixels disposed in one line (for example, a gate line) of a panel. The latch unit 110 may receive pixel data D1 through Dm having digital values and latch the received pixel data D1 through Dm. The latch unit 110 may store the received pixel data D1 through Dm and output the stored pixel data D1 through Dm to the decoding unit 120 in a parallel method. The decoding unit 120 may decode the pixel data D1 through Dm corresponding to digital signals into analog voltage signals. The decoding unit 120 may include decoders (not shown), the number of which corresponds to the number of channels of the source driver 100, and pixel data D1 through Dm corresponding to each channel and a plurality of gradation voltages VG[1:a] may be provided to each of the decoders. The decoders may decode the pixel data D1 through Dm, and may select and output any one gradation voltage from among the plurality of gradation voltages VG[1:a], based on a decoding result. For example, when each of the pixel data D1 through Dm includes data of k bits and the plurality of gradation voltages VG[1:a] include $2^k$ gradation voltages, each decoder may decode the pixel data D1 through Dm formed of k bits and select and output any one gradation voltage.

The source driver 100 may include a gradation voltage generating unit (e.g., gradation voltage generator) for generating the plurality of gradation voltages VG[1:a]. Voltages generated from the gradation voltage generating unit may be referred to as a reference gradation voltage VG[1:a], and voltages selected by the decoding unit 120 in correspondence to each of the m channels may be referred to as gradation voltages V1 through Vm.

The gradation voltages V1 through Vm that are output from the decoding unit 120 may be provided to the data lines through the buffer unit 130, as the data signals Y1 through Ym. The buffer unit 130 may receive the gradation voltages V1 through Vm, and may generate the data signals Y1 through Ym for driving the data lines by buffering the received gradation voltages V1 through Vm. The buffer unit 130 may include m output buffers corresponding to the m channels.

According to an exemplary embodiment, in the case of a liquid crystal display device, a panel may be driven by a polarity reversal method, in order to prevent deterioration in a characteristic of a liquid crystal. Accordingly, the source driver 100 may generate and output the data signals Y1 through Ym having different polarities based on predetermined units (for example, a scan unit, a frame unit, or other types of units related to displaying information). When the polarity reversal method is used, the buffer unit 130 may include output buffers, the number of which is greater than m, in correspondence to the m channels. Hereinafter, the output buffer included in the buffer unit 130 may also be referred to as the "buffer".

The charge sharing switch unit 140 may be selectively switched during a charge sharing operation of the data lines. During the charge sharing operation, since the plurality of data lines are electrically connected to one another, charges stored in the plurality of data lines may be shared by one another. For the charge sharing operation, charge sharing switches included in the charge sharing switch unit 140 are turned on so that the plurality of data lines may be electrically connected to one another and an output of the buffer unit 130 may be blocked (alternatively, an output driving unit in the buffer unit 130 may be disabled).

The control logic 150 may receive a polarity control signal POL and a clock signal CLK, and may generate various control signals Ctrl_NC, Ctrl_DE, and Ctrl_CS by using the received polarity control signal POL and clock signal CLK. The polarity control signal POL is a signal having a cycle related to a polarity driving operation of a panel. For example, the polarity control signal POL has a cycle corresponding to one scan unit or a cycle corresponding to two or more scan units. Alternatively, the polarity control signal POL may have a cycle corresponding to one frame unit.

For example, the first control signal Ctrl_CS may control the charge sharing switches included in the charge sharing switch unit 140. As described above, since the charge sharing switches are turned on in response to the first control signal Ctrl_CS during the charge sharing operation, the plurality of data lines may be electrically connected to one another.

Also, according to the second control signal Ctrl_13 De, the output of the buffer unit 130 may be blocked during the charge sharing operation, and thus, the electrical connection between the output of the buffer unit 130 and the data lines may be broken. For example, an output driving unit (not shown) in the buffer unit 130 may be disabled in response to the second control signal Ctrl_De.

To electrically disconnect the output of the buffer unit 130 and the data lines, for the charge sharing operation, the output driving unit of the buffer unit 130 may be disabled, without a need to add an additional switch of a large size between the output of the buffer unit 130 and the data lines. Each of the buffers included in the buffer unit 130 may include a feedback path, an output of which is provided to an input end of the buffer. However, when the output driving unit of the buffer unit 130 is disabled during the charge sharing operation, the feedback path may be broken. When the feedback path is broken, the buffer unit 130 may not normally perform a buffer function and may instead operate as a comparator. Accordingly, during the charge sharing operation, the buffer unit 130 may not maintain a voltage level of a node in a normal state, and one or more nodes in the buffer unit 130 may be changed to a ground voltage level or a power level. In this case, when the charge sharing operation is ended and an operation of driving the data lines is re-started, distortion may occur in an output waveform of the buffer unit 130.

According to an exemplary embodiment, during the charge sharing operation, in order to adjust the nodes in the buffer unit 130 to have a level corresponding to a normal state, the third control signal Ctrl_NC is provided to the buffer of the buffer unit 130 so that the voltage levels of the nodes in the buffer are adjusted. For example, the buffer may include an input unit (e.g., inputter) for receiving a gradation voltage and a feedback voltage as an input signal, an amplification unit (e.g., amplifier) for amplifying the input signal, and an output driving unit (e.g., output driver) for generating a data signal according to the amplification operation, and voltage levels of at least two nodes in the amplification unit may be adjusted according to the third control signal Ctrl_NC. For example, the amplification unit may include one or more current mirrors, and voltage levels of at least two nodes in each of the current mirrors may be adjusted according to the third control signal Ctrl_NC.

Although FIG. 1 exemplarily illustrates that the above described first through third control signals Ctrl_CS, Ctrl_DE, and Ctrl_NC are different control signals, exemplary embodiments are not limited thereto. For example, since each of the first through third control signals Ctrl_CS, Ctrl De, and Ctrl_NC corresponds to a signal for controlling various switches during the charge sharing operation, the first through third control signals Ctrl_CS, Ctrl_DE, and Ctrl_NC may be substantially the same signals or signals having complementary levels.

Figure 2:
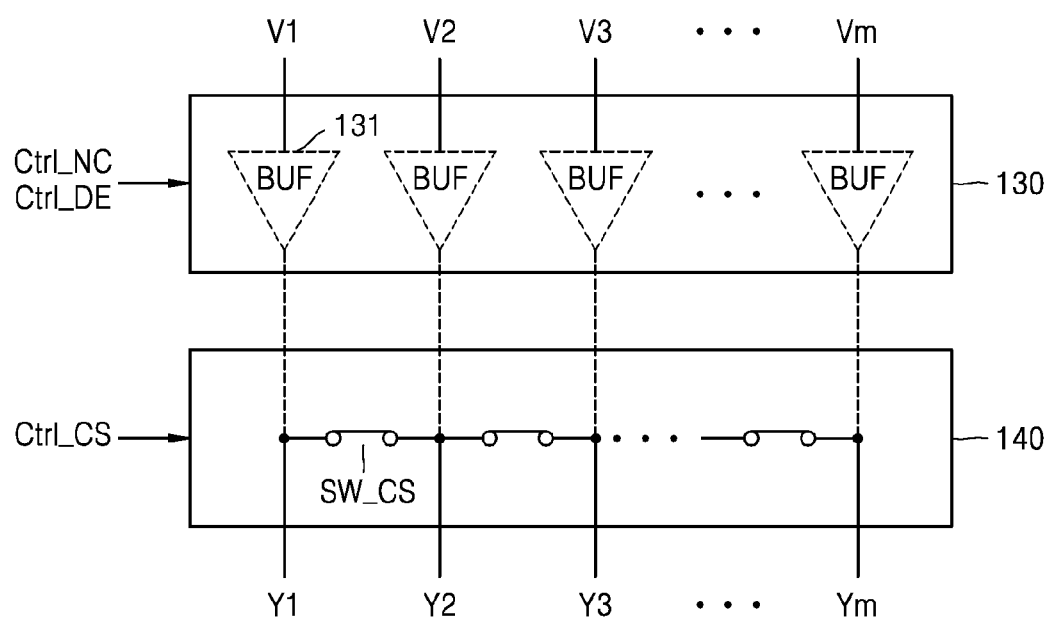
FIG. 2 is a block diagram of an exemplary embodiment of a buffer unit and a charge sharing switch unit of FIG. 1.

FIG. 2 is a block diagram of an exemplary embodiment of the buffer unit 130 and the charge sharing switch unit 140 of FIG. 1.

Referring to FIGS. 1 and 2, the buffer unit 130 may include a plurality of buffers 131 corresponding to a plurality of channels. For example, data signals Y1 through Ym may be provided to the data lines from m buffers 131, via m channels. The buffer unit 130 may operate in response to the second control signal Ctrl_DE and the third control signal Ctrl_NC, which are control signals among various control signals. Also, the charge sharing switch unit 140 may operate in response to the first control signal Ctrl_CS.

During the charge sharing operation, an output driving unit of the buffers 131 in the buffer unit 130 is disabled, and thus, outputs of the buffers 131 and the data lines may be electrically disconnected. As illustrated in FIG. 2, the output driving units of the buffers 131 are disabled, as represented by the dotted lines. According to an exemplary embodiment, the buffer unit 130 may include an additional switch for disabling the output driving unit, and the additional switch may be turned off in response to the second control signal Ctrl_DE during the charge sharing section.

Each charge sharing switch SW_CS included in the charge sharing switch unit 140 may be disposed between two data lines. Each data line operates as a load, and thus, each data line may have a resistance and a capacitance element. Accordingly, each data line may store a charge.

During the charge sharing operation, at least two data lines are electrically connected to each other, and thus, charges of the data lines which are electrically connected may be shared. Accordingly, each data line may have a level proximate to a predetermined voltage level (for example, a common voltage level), after the charge sharing operation. Also, according to an exemplary embodiment, during the charge sharing operation, all data lines may be electrically connected to one another. For the electrical connection, the charge sharing switch SW_CS included in the charge sharing switch unit 140 may operate in response to the first control signal Ctrl_CS.

Figure 3:
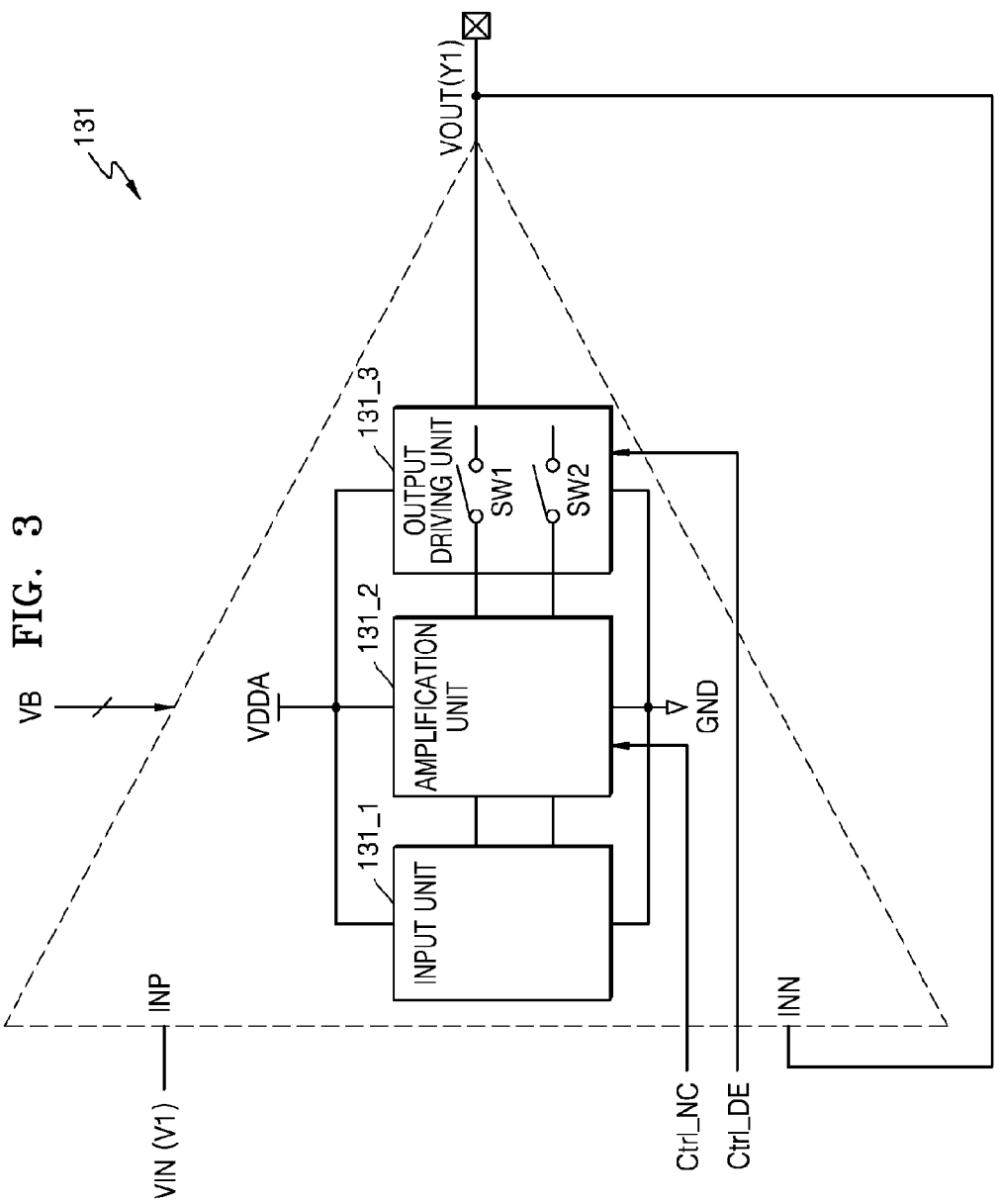
FIG. 3 is a block diagram of an exemplary embodiment of a buffer of FIG. 2.

FIG. 3 is a block diagram of an exemplary embodiment of one of the buffers 131 of FIG. 2.

Referring to FIGS. 1 through 3, the buffer 131 may include an input unit 131_1 (e.g., inputter), an amplification unit 131_2 (e.g., amplifier), and an output driving unit 131_3 (e.g., output driver), and bias voltages VB of various levels may be provided to the buffer 131. According to the bias voltages VB, currents (for example, static currents) flowing in the input unit 131_3, the amplification unit 131_2, and the output driving unit 131_3 may be controlled. The input unit 131_1, the amplification unit 131_2, and the output driving unit 131_3 may be connected between predetermined voltages. For example, the input unit 131_1, the amplification unit 131_2, and the output driving unit 131_3 may be connected between a power voltage VDDA and a ground voltage GND.

FIG. 3 illustrates that the buffers 131 include three circuit blocks. However, exemplary embodiments are not limited thereto. For example, the buffers 131 may include a plurality of circuits for outputting a driving signal VOUT as a data signal, in correspondence to an input signal VIN, and the plurality of circuits may be grouped into blocks of various shapes. According to an exemplary embodiment, the circuits of the buffers 131 may be grouped such that each of the buffers 131 includes an input unit and an output driving unit.

The buffer 131 illustrated in FIG. 3 may be disposed in correspondence to a first channel. Accordingly, the buffer 131 may receive a first gradation voltage V1 as the input signal VIN, via a first input end (for example, a positive input end, INP). Also, the buffer 131 may receive the driving signal VOUT corresponding to a first data signal Y1, via a second input end (for example, a negative input end INN). That is, the buffer 131 may include a negative feedback path.

The input unit 131_1 has a differential mode input structure, and thus, the input unit 131_1 may receive two input signals VIN and VOUT having a complementary relationship. Also, the amplification unit 131_2 may receive and amplify signals that are output from the input unit 131_1. According to an exemplary embodiment, the amplification unit 131_2 may be realized as a folded cascode structure. Also, the amplification unit 131_2 may include one or more current mirrors, and the amplification operation of the amplification unit 131_2 may include a current mirroring operation of each current mirror.

According to exemplary embodiments, the output driving unit 131_3 may be disabled by the second control signal Ctrl_DE during the charge sharing operation. According to an exemplary embodiment, one or more switches (for example, enable switches SW1 and SW2) for controlling an enabling or disabling operation of the output driving unit 131_3 may be disposed inside or outside the output driving unit 131_3. When the one or more switches SW1 and SW2 are turned off by the second control signal Ctrl_DE during the charge sharing operation, the output driving unit 131_3 may be disabled.

When the output driving unit 131_3 is disabled, a feedback path (for example, a negative feedback path) of the buffers 131 is broken, and thus, the buffers 131 may operate as a comparator outputting a signal of logic high or a signal of logic low, according to a comparison result of two input signals, rather than performing a normal operation as an analog buffer. If the feedback path of the buffers 131 is broken as described above, an output voltage or the inside voltage of the buffers 131 is changed to a power level or a ground level and distortion may occur in an output waveform when an operation of driving the data line is performed after the charge sharing operation is completed.

According to an exemplary embodiment, various switches in the buffers 131 are controlled so that voltage levels of the various nodes in the buffers 131 correspond to normal states during the charge sharing operation. For example, the amplification unit 131_2 further includes an additional switch (for example, a connection switch) connected between a plurality of nodes in the current mirror, and when the connection switch is turned on during the charge sharing operation, the plurality of nodes in the current mirror are electrically connected to one another. Accordingly, even if the feedback path of the buffers 131 is broken, the voltage levels of the various nodes (for example, the node inside the current mirror or the node outside the current mirror) in the amplification unit 131_2 may not be changed to the power level or the ground level, and the voltages of the various nodes may maintain levels corresponding to a normal state.

Accordingly, when the operation of driving the data line is re-started after the charge sharing operation is completed, the distortion in the output waveform may be prevented from occurring.

Figure 4:
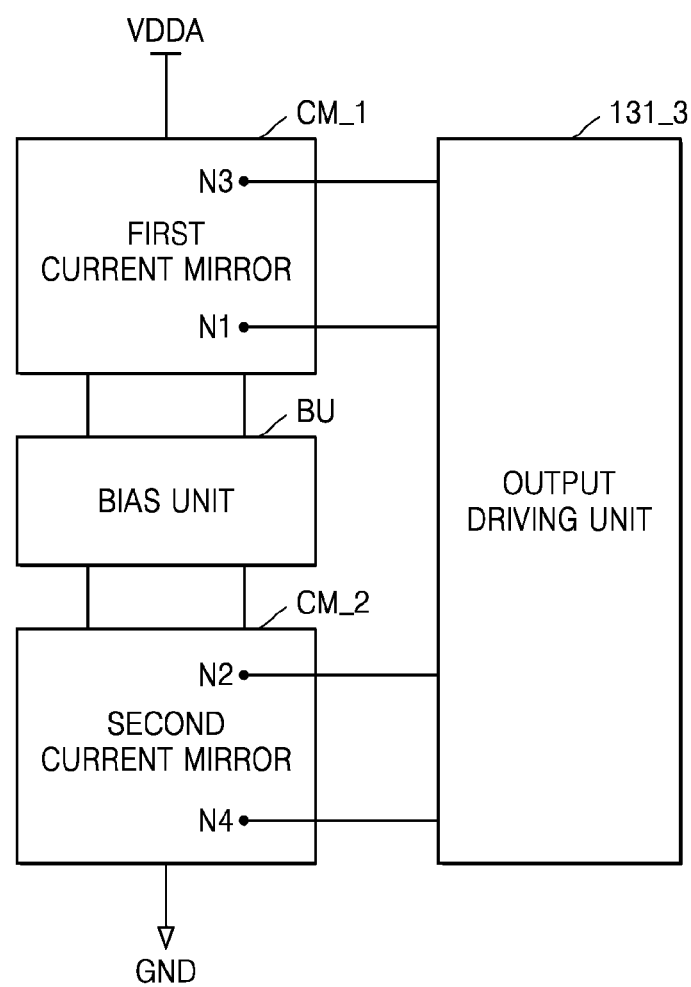
FIG. 4 is a block diagram of an exemplary embodiment of an amplification unit of FIG. 3.
Figure 5:
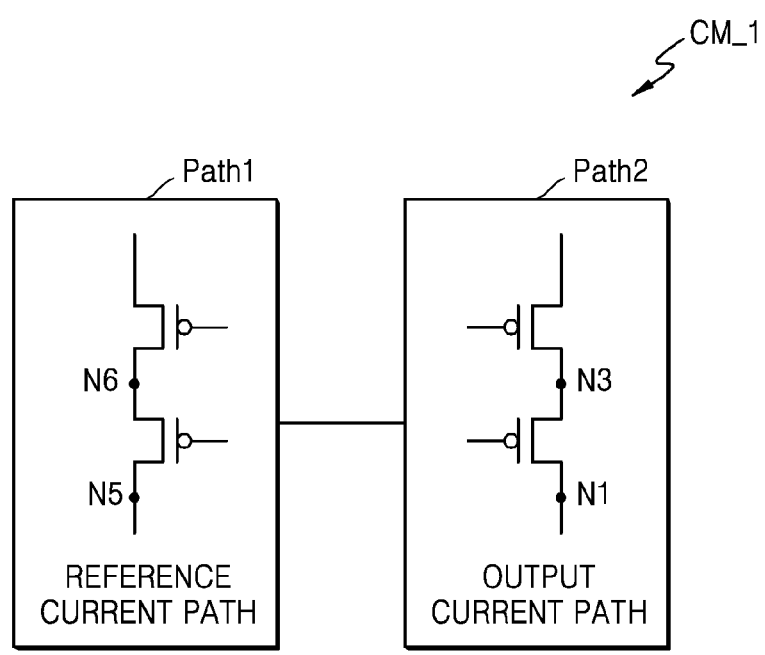
FIG. 5 is a block diagram of an exemplary embodiment of a first current mirror of FIG. 4.

The operation of the source driver, according to an exemplary embodiment, will be described by referring to FIGS. 4 and 5. FIG. 4 is a block diagram of an exemplary embodiment of the amplification unit 131_2 of FIG. 3, and FIG. 5 is a block diagram of an exemplary embodiment of the first current mirror CM_1 of FIG. 4.

The amplification unit 131_2 may include at least one current mirror. For example, the amplification unit 131_2 may include a first current mirror CM_1 as an upper current mirror and a second current mirror CM_2 as a lower current mirror. Each current mirror may include at least a pair of transistors, gates of which are connected to each other. For example, each current mirror may include two pairs of transistors. Also, the amplification unit 131_2 may further include a bias unit BU (e.g., bias device), and the bias unit BU may include one or more transistors operating in response to one or more bias voltages.

The amplification unit 131_2 may include a plurality of nodes. For example, the amplification unit 131_2 may include an output node including a first node N1 and a second node N2. Also, the amplification unit 131_2 may further include a plurality of nodes located in the first and second current mirrors CM_1 and CM_2. For example, FIG. 4 illustrates a third node N3, which is a node between the transistors in the first current mirror CM_1, and a fourth node N4, which is a node between the transistors in the second current mirror CM_2. Also, although FIG. 4 exemplarily illustrates that the first node N1 and the second node N2 are located inside the first and second current mirrors CM_1 and CM_2, as the output node of the amplification unit 131_2, the output node may be defined as a node located between the first and second current mirrors CM_1 and CM_2 and the bias unit BU.

The output driving unit 131_3 may receive various output signals from the amplification unit 131_2. The output driving unit 131_3 may be connected to the first and second nodes N1 and N2 as the output node of the buffers 131, and the output driving unit 131_3 may be connected to the third and fourth nodes N3 and N4 as the nodes in the first and second current mirrors CM_1 and CM_2.

As illustrated in FIG. 5, the first current mirror CM_1 may include a reference current path Path 1 in which a reference current flows and an output current path Path 2 in which an output current flows. When the first current mirror CM_1 operates in a normal condition, a level of the current flowing through the output current path Path 2 by a current mirroring operation may correspond to a level of the reference current flowing through the reference current path Path 1. Also, each of the reference current path Path 1 and the output current path Path 2 may include a plurality of nodes. For example, the output current path Path 2 may include the first node N1 as the output node of the buffers 131, as described above. Also, the output current path Path 2 may include the third node N3 inside the first current mirror CM_1, as described above.

Similarly, the reference current path Path 1 may include a fifth node N5 connected to the bias unit BU and a sixth node N6 in the first current mirror CM_1. According to the above-described exemplary embodiment, the operation of electrically connecting the nodes inside the first current mirror CM_1 during the charge sharing operation may include electrically connecting at least one node of the reference current path Path 1 and at least one node of the output current path Path 2.

According to exemplary embodiments, the fifth node N5 of the reference current path Path 1 may be connected to any one of the first node N1 and the third node N3 of the output current path Path 2. Alternatively, the sixth node N6 of the reference current path Path 1 may be connected to any one of the first node N1 and the third node N3 of the output current path Path 2. As another alternative, the fifth node N5 of the reference current path Path 1 may be connected to one of the first node N1 and the third node N3 of the output current path Path 2, and the sixth node N6 of the reference current path Path 1 may be connected to the other of the first node N1 and the third node N3 of the output current path Path2.

According to an exemplary embodiment, the second current mirror CM_2 may also include a reference current path and an output current path, and each of the reference current path and the output current path may include a plurality of nodes. During the charge sharing operation, at least one node of the reference current path of the second current mirror CM_2 and at least one node of the output current path of the second current mirror CM_2 may be electrically connected to each other. Accordingly, voltage levels of various nodes of the second current mirror CM_2 may be adjusted.

Figure 6:
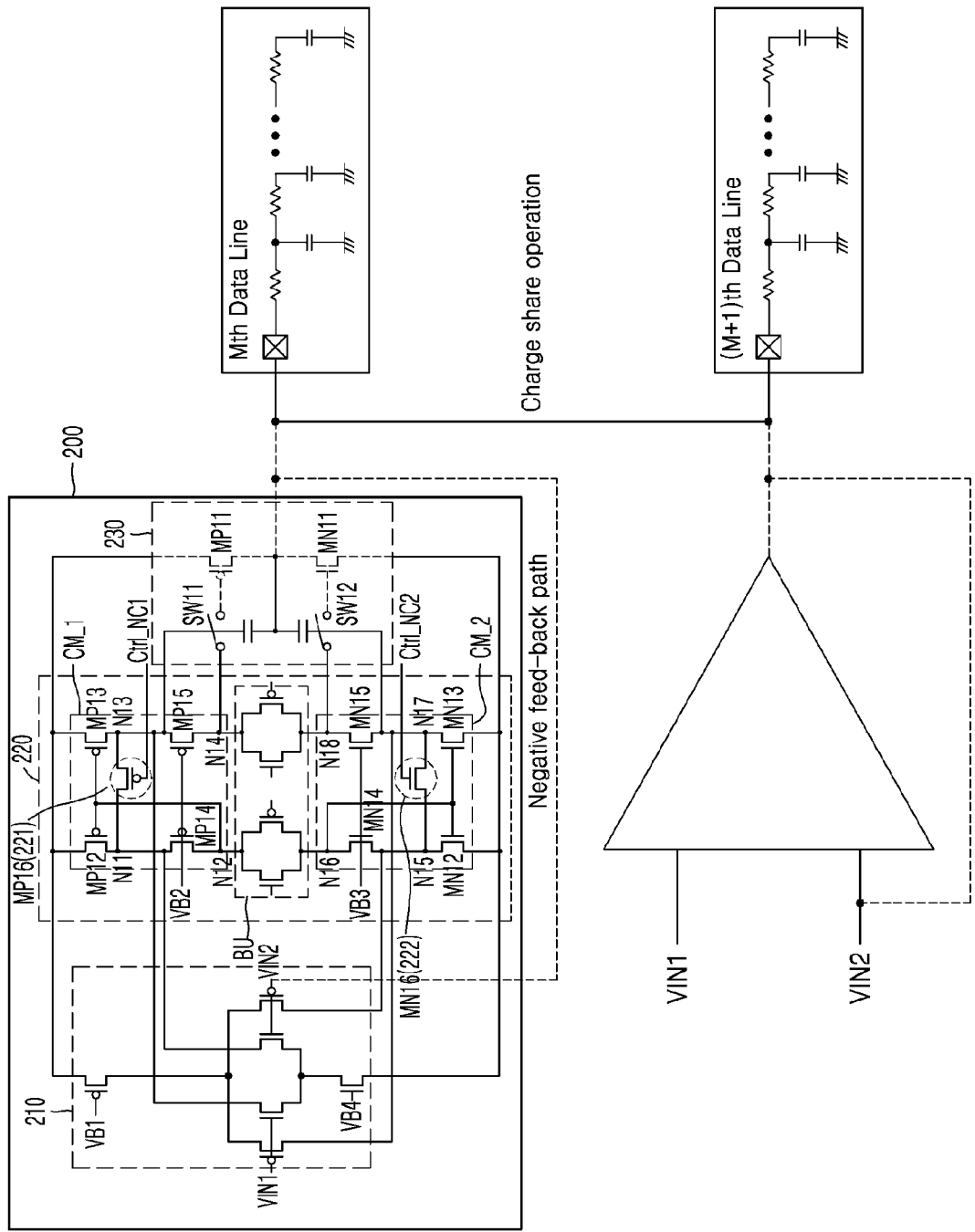
FIG. 6 is a circuit diagram of an exemplary embodiment of an output buffer of source drivers according to exemplary embodiments.

FIG. 6 is a circuit diagram of an exemplary embodiment of an output buffer of source drivers according to exemplary embodiments. FIG. 6 illustrates a buffer configured to drive an $m^{th}$ data line and a buffer configured to drive an $m+1^{th}$ data line. Also, each of the $m^{th}$ data line and the $m+1^{th}$ data line may include a resistance and a capacitance element. FIG. 6 illustrates an example in which the $m^{th}$ data line and the $m+1^{th}$ data line are electrically connected to each other via a charge sharing switch, during a charge sharing operation. However, exemplary embodiments are not limited thereto. For example, data lines which are not adjacent to each other may be connected via the charge sharing switch.

A structure and an operation of the buffer 200 of FIG. 6 will be described below. For convenience of explanation, the structure and the operation of the $m^{th}$ buffer will be primarily described, and it is understood that the $m+1^{th}$ buffer may be realized and may operate in the same or substantially the same fashion as the $m^{th}$ buffer.

The buffer 200 may include an input unit 210 (e.g., inputter), an amplification unit 220 (e.g., amplifier), and an output driving unit 230 (e.g., outputter), and the output driving unit 230 may be disabled during the charge sharing operation. The output driving unit 230 may further include switches SW11 and SW12 for controlling an enabling or disabling operation. The switches SW11 and SW12 may be connected between output nodes N14 and N18 of the amplification unit 220 and driving transistors MP11 and MN11 of the output driving unit 230. During the charge sharing operation, the switches SW11 and SW12 are turned off so that the output driving unit 230 is disabled, and an output of the buffer 200 and a data line may be disconnected.

The input unit 210 receives a first input signal VIN1 corresponding to a gradation voltage and a second input signal VIN2 provided through a negative feedback path of the buffer 200. The first input signal VIN1 and the second input signal VIN2 may have a complementary relationship. The input unit 210 may include transistors receiving the first input signal VIN1 and the second input signal VIN2. Also, the input unit 210 may further include a p-type metal-oxide-semiconductor (PMOS) transistor, to which a first bias voltage VB1 is applied, and an n-type metal-oxide-semiconductor (NMOS) transistor, to which a fourth bias voltage VB4 is applied.

The amplification unit 220 may be realized as a folded cascode type. The amplification unit 220 may receive output signals of the input unit 210 and amplify the first and second input signals VIN1 and VIN2. The amplification unit 220 may include one or more current mirrors. According to an exemplary embodiment, the amplification unit 220 may include a first current mirror CM_1 and a second current mirror CM_2. Also, the amplification unit 220 may further include a bias unit BU connected between the first current mirror CM_1 and the second current mirror CM_2 and including one or more PMOS transistors and one or more NMOS transistors. Gates of the PMOS transistor and the NMOS transistor of the bias unit BU may be applied with a bias voltage having a predetermined level.

Each of the first current mirror CM_1 and the second current mirror CM_2 may be realized in various ways. For example, the first current mirror CM_1 may include a plurality of PMOS transistors MP12 through MP15 (e.g., MP12, MP13, MP14, and MP15) performing a current mirroring operation, and the second current mirror CM_2 may include a plurality of NMOS transistors MN12 through MN15 (e.g., MN12, MN13, MN14, and MN15) performing a current mirroring operation. A bias voltage may be provided to each of the first and second current mirrors CM_1 and CM_2. For example, a second bias voltage VB2 may be applied to the first current mirror CM_1 and a third bias voltage VB3 may be applied to the second current mirror CM_2.

Also, according to the above described exemplary embodiment, each of the first current mirror CM_1 and the second current mirror CM_2 may include a reference current path and an output current path. One or more transistors may form the reference current path or the output current path. For example, the first current mirror CM_1 may include the reference current path including PMOS transistors MP12 and MP14 and the output current path including PMOS transistors MP13 and MP15. Also, the second current mirror CM_2 may include the reference current path including NMOS transistors MN12 and MN14 and the output current path including NMOS transistors MN13 and MN15.

Since the transistors are arranged as described above, the amplification unit 220 may include a plurality of nodes. The reference current path of the first current mirror CM_1 may include a first node N11 and a second node N12, and the output current path of the first current mirror CM_1 may include a third node N13 and a fourth node N14. Also, the reference current path of the second current mirror CM_2 may include a fifth node N15 and a sixth node N16, and the output current path of the second current mirror CM_2 may include a seventh node N17 and an eighth node N18. The fourth node N14 and the eighth node N18 from among the above nodes may form an output node of the amplification unit 220.

According to an exemplary embodiment, one or more switches may be further disposed for adjusting voltage levels of the nodes in the buffer 200 during the charge sharing operation. For example, the first current mirror CM_1 may include a first connection switch 221, and the first connection switch 221 may include a PMOS transistor MP16. Similarly, the second current mirror CM_2 may include a second connection switch 222, and the second connection switch 222 may include an NMOS transistor MN16. The first connection switch 221 and the second connection switch 222 may be turned on by connection control signals Ctrl_NC1 and Ctrl_NC2, respectively, so that at least two nodes of the amplification unit 220 are electrically connected to each other during a charge sharing operation, and voltage levels of the electrically connected nodes may be adjusted.

The output driving unit 230 may include one or more capacitors for stabilizing a frequency characteristic of a data signal, and may output a driving signal as the data signal via an output end. The one or more capacitors may reduce or prevent oscillations in the output of the buffer 200 and may be referred to as a compensation capacitor.

When the enable switches SW11 and SW12 are turned off during the charge sharing operation, the output driving unit 230 is disabled, while when the first and second connection switches 221 and 222 are turned on, the plurality of nodes in the amplification unit 220 may be electrically connected to one another. For example, since the first node N11 of the reference current path of the first current mirror CM_1 and the third node N13 of the output current path of the first current mirror CM_1 are electrically connected to each other, voltage levels of the first and third nodes N11 and N13 may become the same. Similarly, since the fifth node N15 of the reference current path of the second current mirror CM_2 and the seventh node N17 of the output current path of the second current mirror CM_2 are electrically connected to each other, voltage levels of the fifth and seventh nodes N15 and N17 may become the same.

According to the structure and the connection relationship described above, the output driving unit 230 is disabled during the charge sharing operation, and thus, the negative feedback path is broken. However, according to the operations of the first connection switch 221 and the second connection switch 222, the voltages of the nodes in the amplification unit 220 may not be changed to a power level or a ground level, and may be maintained as a constant level. That is, even if the negative feedback path is broken during the charge sharing operation, various nodes in the buffer 200 may maintain a voltage level corresponding to a normal state.

According to the above described exemplary embodiment, there is no need to provide a switch of a relatively large size to break a connection between the output of the buffer and the data line, when performing the charge sharing operation. Also, since only the first and second switches 221 and 222 of relatively small sizes are disposed in the buffer 200 (or the amplification unit), an occurrence of distortion in a driving signal of the data line after the charge sharing operation may be prevented. Accordingly, a manufacturing cost of the source driver including the buffer 200 may be reduced and a size of the source driver may be decreased.

Figure 7A:
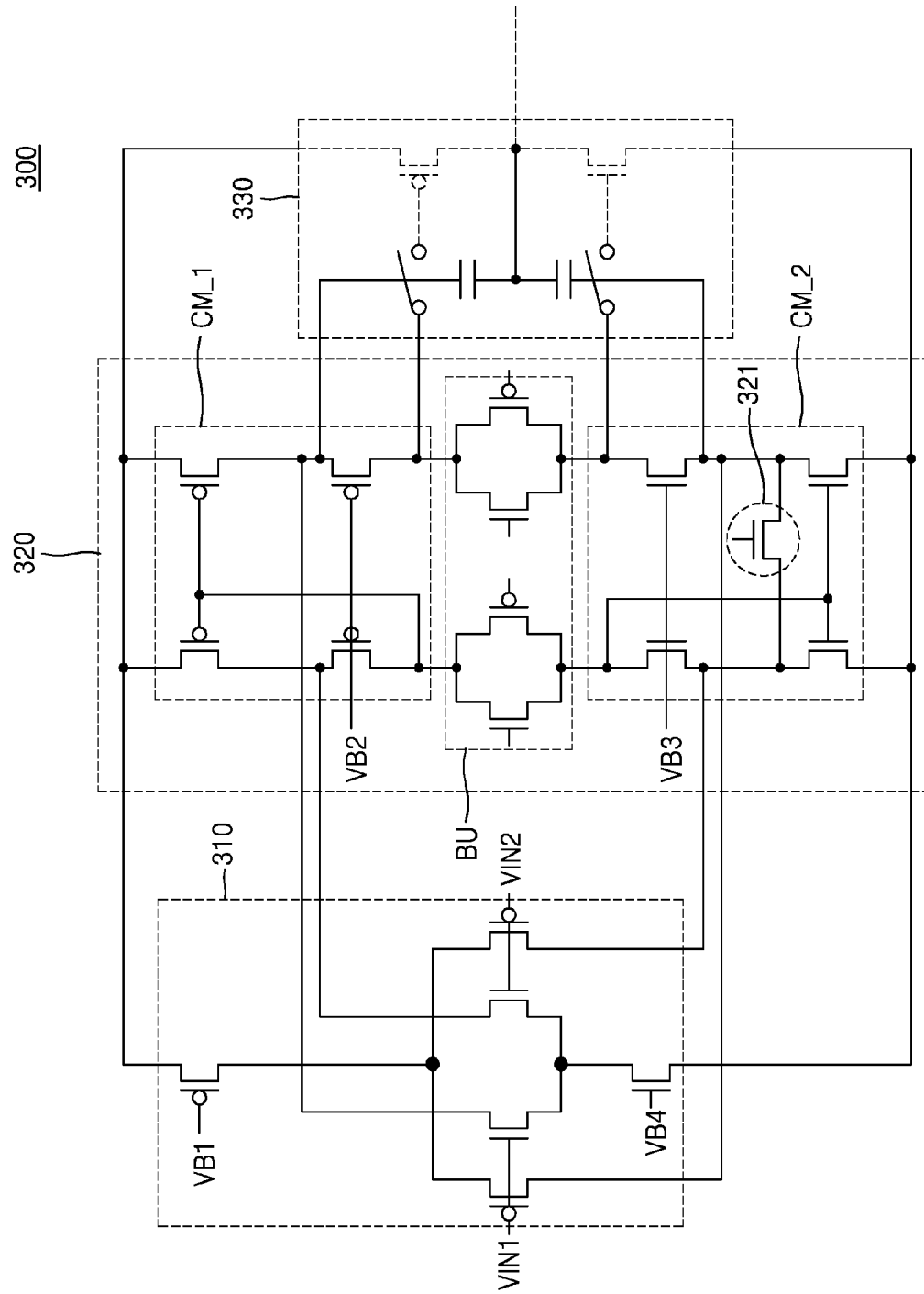
FIGS. 7A and 7B are circuit diagrams of exemplary embodiments of an output buffer of source drivers according to exemplary embodiments.
Figure 7B:
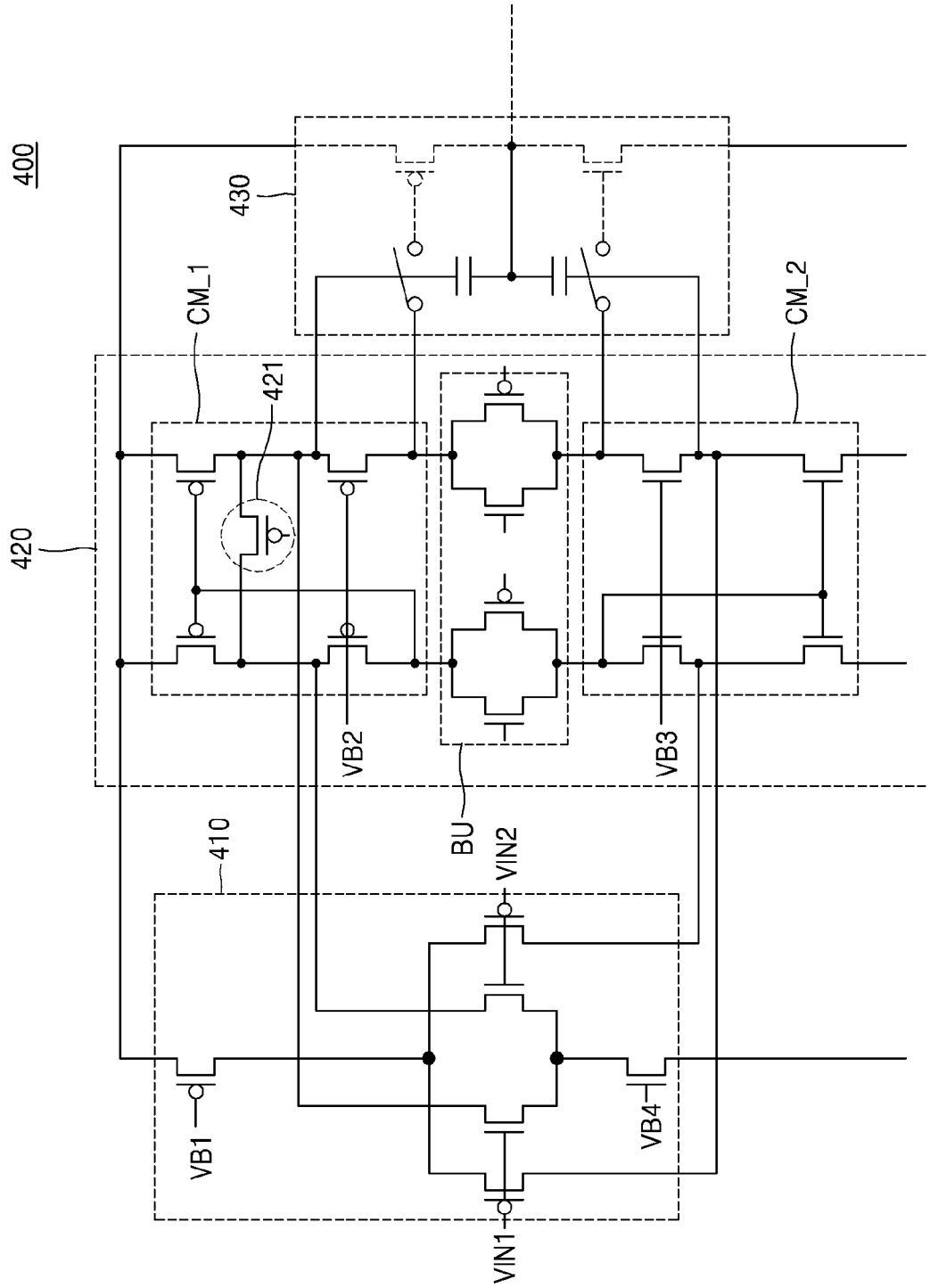

FIGS. 7A and 7B are circuit diagrams of exemplary embodiments of an output buffer of source drivers according to exemplary embodiments. FIGS. 7A and 7B illustrate the exemplary embodiments of the output buffer, wherein the output buffer corresponds to one data line. Each of the other output buffers included in the source driver may have the same or substantially the same configurations as the buffer illustrated in FIGS. 7A and 7B. In describing structures and operations of buffers 300 and 400 of FIGS. 7A and 7B, the same components as FIG. 6 have the same operations as FIG. 6, and thus, their detailed descriptions will be omitted. Also, since a feedback path of the buffer is broken during a charge sharing operation, for convenience of explanation, the feedback path of the buffer will not be illustrated in the following exemplary embodiment.

As illustrated in FIG. 7A, the buffer 300 may include an input unit 310 (e.g., inputter), an amplification unit 320 (e.g., amplifier), and an output driving unit 330 (e.g., output driver), and the amplification unit 320 may include a first current mirror CM_1 and a second current mirror CM_2. Also, according to an exemplary embodiment, the amplification unit 320 may further include a bias unit BU. During the charge sharing operation, the output driving unit 330 may be disabled, and the illustration of driving transistors included in the output driving unit 330 in dotted lines in FIG. 7 may indicate that the output driving unit 330 corresponds to a disabled state. According to an exemplary embodiment, in order to disable the output driving unit 330, switches connected to gates of the driving transistors of the output driving unit 330 may be turned off.

According to the above described exemplary embodiments, one or more connection switches 321 which are selectively turned on during the charge sharing operation may be included in the buffer 300. FIG. 7A illustrates an example in which the connection switch 321 is disposed in the second current mirror CM_2. Since the connection switch 321 is turned on during the charge sharing operation, a node in a reference current path of the second current mirror CM_2 may be electrically connected with a node in an output current path of the second current mirror CM_2, and various nodes in the buffer 300 may maintain a voltage level corresponding to a normal state, similarly with the above-described exemplary embodiments.

As illustrated in FIG. 7B, the buffer 400 may include an input unit 410 (e.g., inputter), an amplification unit 420 (e.g., amplifier), and an output driving unit 430 (e.g., output driver), and the amplification unit 420 may include a first current mirror CM_1, a bias unit BU, and a second current mirror CM_2. Also, FIG. 7B illustrates an example in which a connection switch 421 is disposed in the first current mirror CM_1, wherein since the connection switch 421 is turned on during the charge sharing operation, a node in a reference current path of the first current mirror CM_1 may be electrically connected with a node in an output current path of the first current mirror CM_1.

Figure 8A:
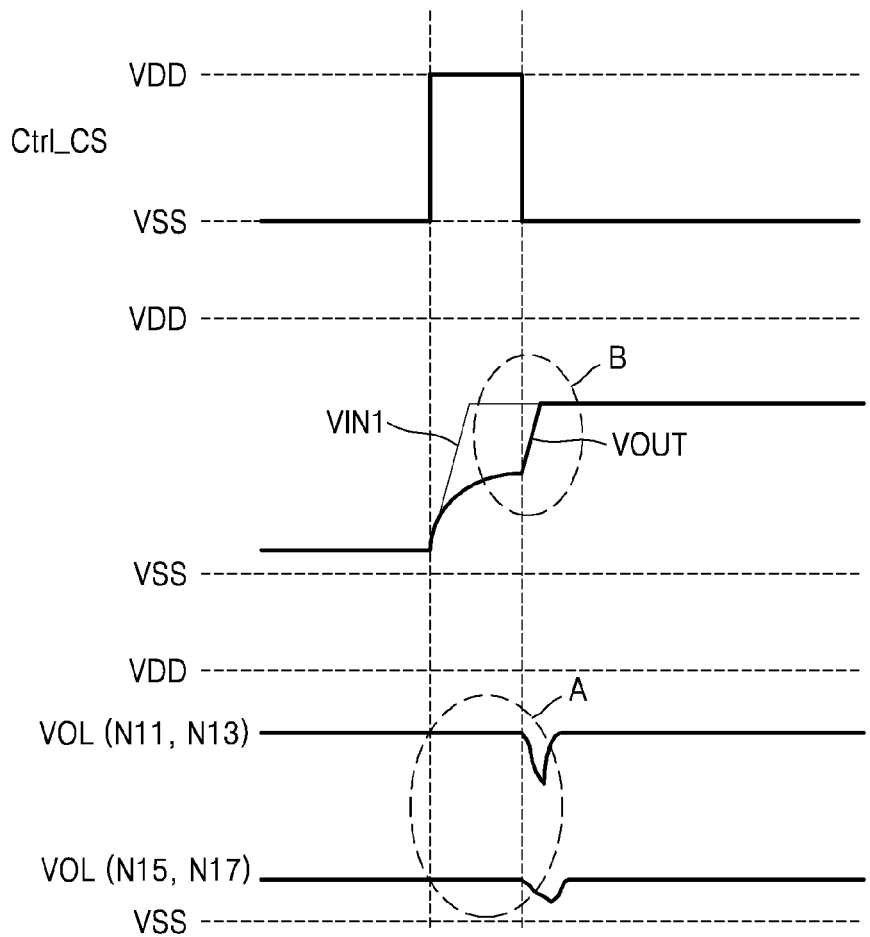
FIGS. 8A and 8B are waveform diagrams indicating an operation characteristic of the output buffer of FIG. 6.
Figure 8B:
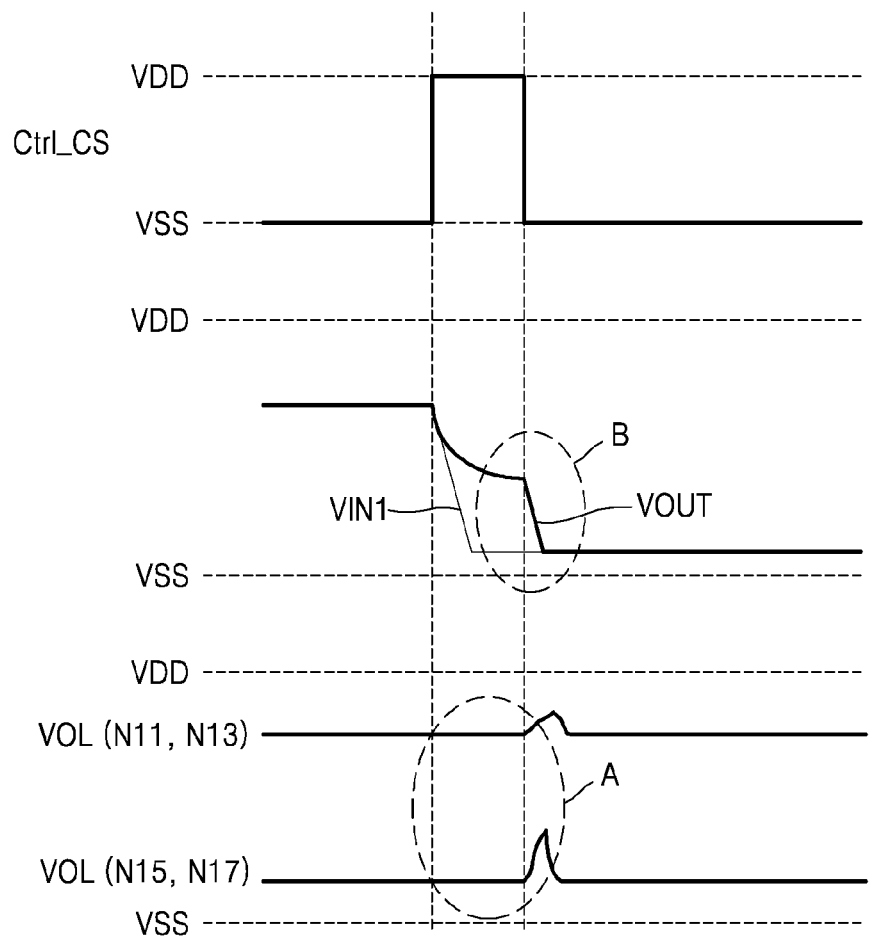

FIGS. 8A and 8B are waveform diagrams indicating an operation characteristic of the buffer 200 illustrated in FIG. 6.

As illustrated in FIGS. 8A and 8B, when a charge sharing section is entered into, a control signal Ctrl_CS has a logic high value during the charge sharing section, in order to turn on charge sharing switches. Since the first and second connection switches 221 and 222 illustrated in FIG. 6 are turned on during the charge sharing operation, the voltage levels of the first and third nodes N11 and N13 may not be changed to a power level or a ground level and may maintain a constant level, as illustrated in portion A. Also, the voltage levels of the fifth and seventh nodes N15 and N17 may not be changed to a power level or a ground level, and may maintain a constant level. That is, even if levels of the input signal VIN1 and the output signal VOUT of the buffer 200 are different from each other during the charge sharing operation, the voltage levels of the nodes may have values corresponding to a normal state of the buffer 200, and thus, an occurrence of distortion in waveforms of the output signal VOUT right after the sharing charge operation is ended may be prevented as illustrated in portion B.

The waveform diagrams of FIGS. 8A and 8B may be similarly applied to the exemplary embodiments of FIGS. 7A and 7B. For example, the voltage levels of the nodes in the second current mirror CM_2 in FIG. 7A may have the waveforms of the nodes N15 and N17 of FIGS. 8A and 8B, and the voltage levels of the nodes in the first current mirror CM_1 in FIG. 7B may have the waveforms of the nodes N11 and N13 of FIGS. 8A and 8B.

Figure 9:
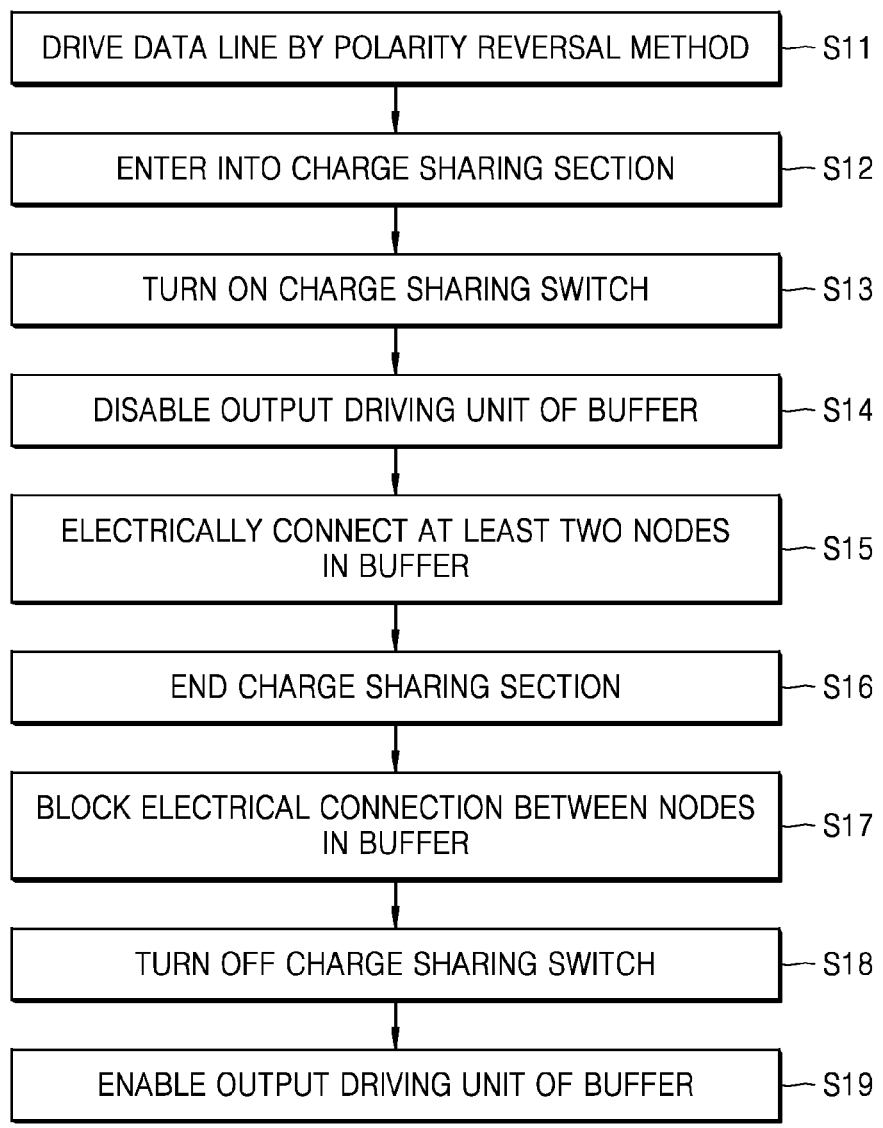
FIG. 9 is a flowchart of an operating method of a source driver, according to an exemplary embodiment.

FIG. 9 is a flowchart illustrating an operating method of a source driver, according to an exemplary embodiment.

The operating method of FIG. 9 may, for example, be used with a panel that may include pixels in an area in which a plurality of gate lines and a plurality of data lines cross each other, and the plurality of data lines may be driven by a plurality of buffers included in the source driver. In driving the data lines, driving may be performed by using a polarity reversal method, in operation S11. Between driving of pixels corresponding to any one gate line and driving of pixels corresponding to a next gate line, a charge sharing section for sharing charges of the plurality of data lines may be entered into, in operation S12.

When the charge sharing section is entered into, a charge sharing switch connected between the plurality of data lines may be turned on, in operation S13, in order to electrically connect the plurality of data lines to one another. Then, in operation S14, an output driving unit of the buffers may be disabled, in order to break the electrical connection between outputs of the buffers and the data lines. Accordingly, a feedback path (for example, a negative feedback path) of the buffers may be broken.

According to an exemplary embodiment, in order to prevent the buffers, a feedback path of which is disconnected, from operating as a comparator, voltage levels of at least two nodes in the buffers are adjusted. For example, a connection switch is disposed between the at least two nodes in the buffer (or the amplification unit of the buffer) and the connection switch is turned on during the charge sharing operation so that the at least two nodes in the buffer are electrically connected to each other, in operation S15.

During the charge sharing section, charges stored in the plurality of data lines are shared by the plurality of data lines, and the charge sharing section ends in operation S16. As the charge sharing section ends, the electrical connection of the at least two nodes in the buffer may be broken (blocked) in operation S17, the charge sharing switch disposed between the data lines may be turned off in operation S18, and since the output driving unit of the buffer is enabled, driving of pixels corresponding to a next gate line may be performed in operation S19.

Figure 10:
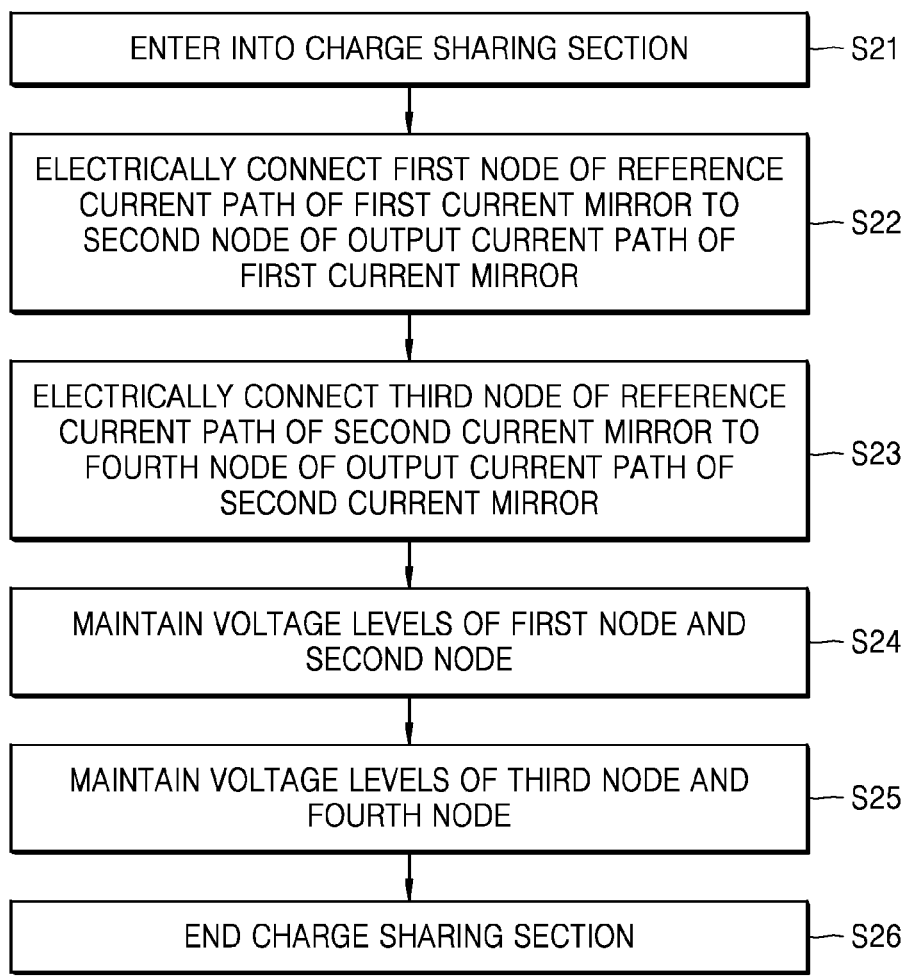
FIG. 10 is a flowchart of an operating method of a source driver, according to an exemplary embodiment.

FIG. 10 is a flowchart of an operating method of a source driver, according to an exemplary embodiment. As described in the above exemplary embodiment, the source driver may include a plurality of buffers for driving data lines, and a plurality of circuits included in each buffer may be divided into an input unit, an amplification unit, and an output driving unit, based on their functions. Also, the amplification unit may include one or more current mirrors, for example, first and second current mirrors. Also, each current mirror may perform a current mirroring function, and thus, each current mirror may include a reference current path and an output current path.

As illustrated in FIG. 10, when a charge sharing section is entered into in operation S21, the output driving unit is disabled so that a feedback path of the buffer is broken. During the charge sharing section, an operation of adjusting voltage levels of various nodes in the buffer is performed. For example, a first node of the reference current path of the first current mirror and a second node of the output current path of the first current mirror may be electrically connected with each other in operation S22. Similarly, a third node of the reference current path of the second current mirror and a fourth node of the output current path of the second current mirror may be electrically connected with each other in operation S23.

According to the connection of the nodes, voltage levels of the electrically connected nodes may be adjusted. For example, voltage levels of the first node and the second node may be maintained as a voltage level corresponding to a normal state in operation S24, and voltage levels of the third node and the fourth node may be maintained as a voltage level corresponding to a normal state, in operation S25. Next, the charge sharing section is ended in operation S26, and the electrical connection between the first node and the second node may be broken, and the electrical connection between the third node and the fourth node may be broken.

Figure 11:
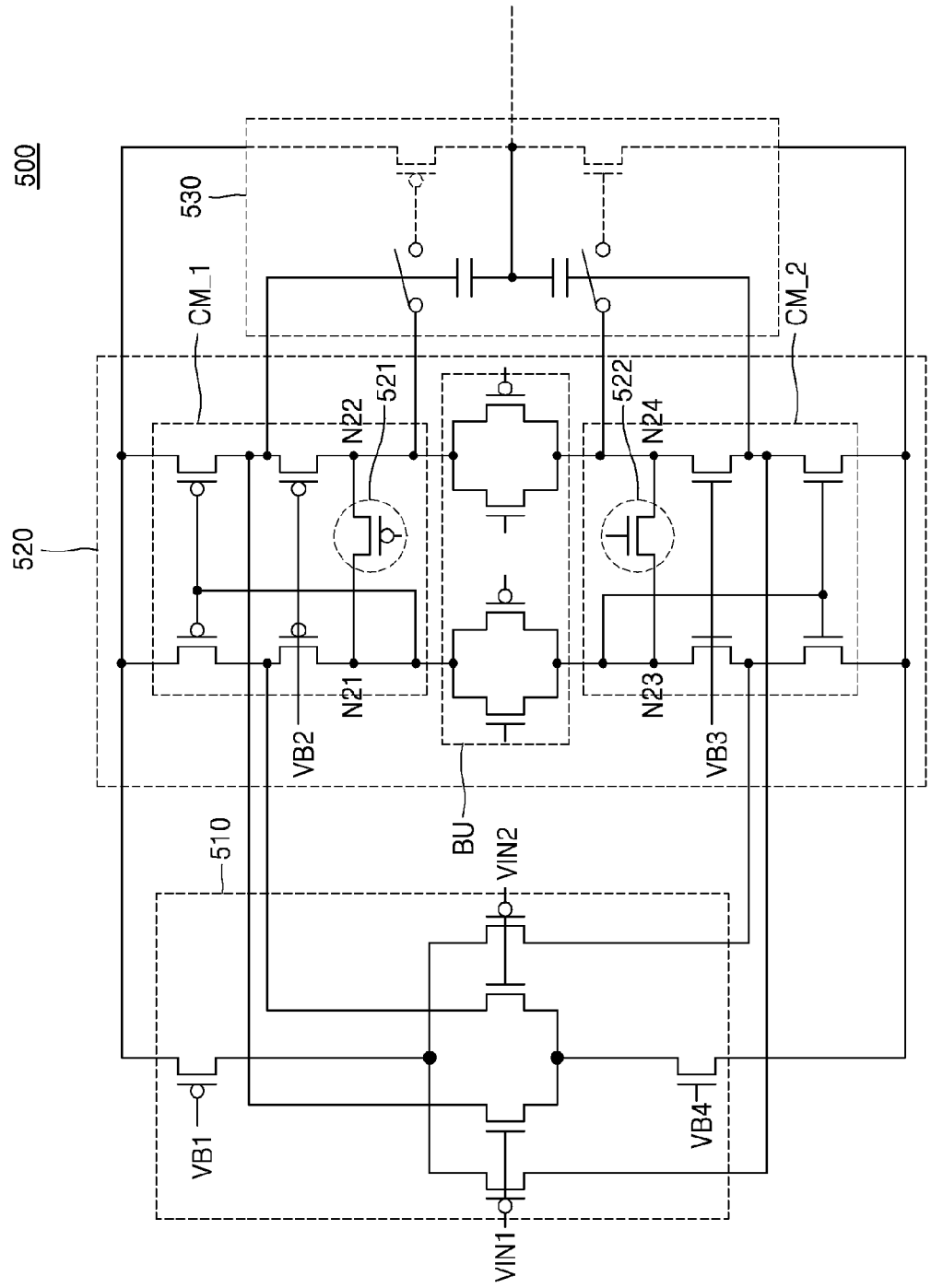
FIG. 11 is a circuit diagram of an exemplary embodiment of an output buffer of source drivers according to exemplary embodiments.

FIG. 11 is a circuit diagram of an exemplary embodiment of an output buffer of source drivers according to exemplary embodiments. In describing a structure and an operation of a buffer 500 of FIG. 11, the same components as those shown in FIG. 6 or FIGS. 7A and 7B have the same operations as those shown in FIG. 6 or FIGS. 7A and 7B, and thus, their detailed descriptions will be omitted.

As illustrated in FIG. 11, the buffer 500 may include an input unit 510 (e.g., inputter), an amplification unit 520 (e.g., amplifier), and an output driving unit 530 (e.g., output driver), and the amplification unit 520 may include a first current mirror CM_1, a bias unit BU, and a second current mirror CM_2. Also, during a charge sharing operation, the output driving unit 530 may be disabled so that a negative feedback path of the buffer 500 may be broken.

With reference to the first current mirror CM_1, a plurality of nodes may be included in a reference current path. For example, any one of the plurality of nodes may correspond to a first node N21, which is a node connected to the bias unit BU. Also, a plurality of nodes may be included in an output current path. For example, any one of the plurality of nodes may correspond to a second node N22, which is a node connected to the bias unit BU.

According to the present exemplary embodiment, during the charge sharing operation, any one node of the reference current path and any one node of the output current path may be electrically connected to each other, and FIG. 11 illustrates an example in which a first connection switch 521 is disposed between the first node N21 and the second node N22. During the charge sharing operation, the first connection switch 521 is turned on, and thus, voltage levels of the first node N21 and the second node N22 of the buffer 500 may maintain a level corresponding to a normal state, even if the negative feedback path is broken.

Similarly, with reference to the second current mirror CM_2, the reference current path may include a third node N23, which is a node connected to the bias unit BU, and the output current path may include a fourth node N24, which is a node connected to the bias unit BU. A second connection switch 522 may be disposed between the third node N23 and the fourth node N24, and during the charge sharing operation, the second connection switch 522 may be turned on. Similar to the above described exemplary embodiments, two or more nodes in the buffer 500 may be electrically connected during the charge sharing operation so that voltage levels of the electrically connected nodes may be adjusted. Thus, deterioration in characteristics of output waveforms of the buffer 500, which may occur due to a break of the feedback path, may be prevented.

Figure 12:
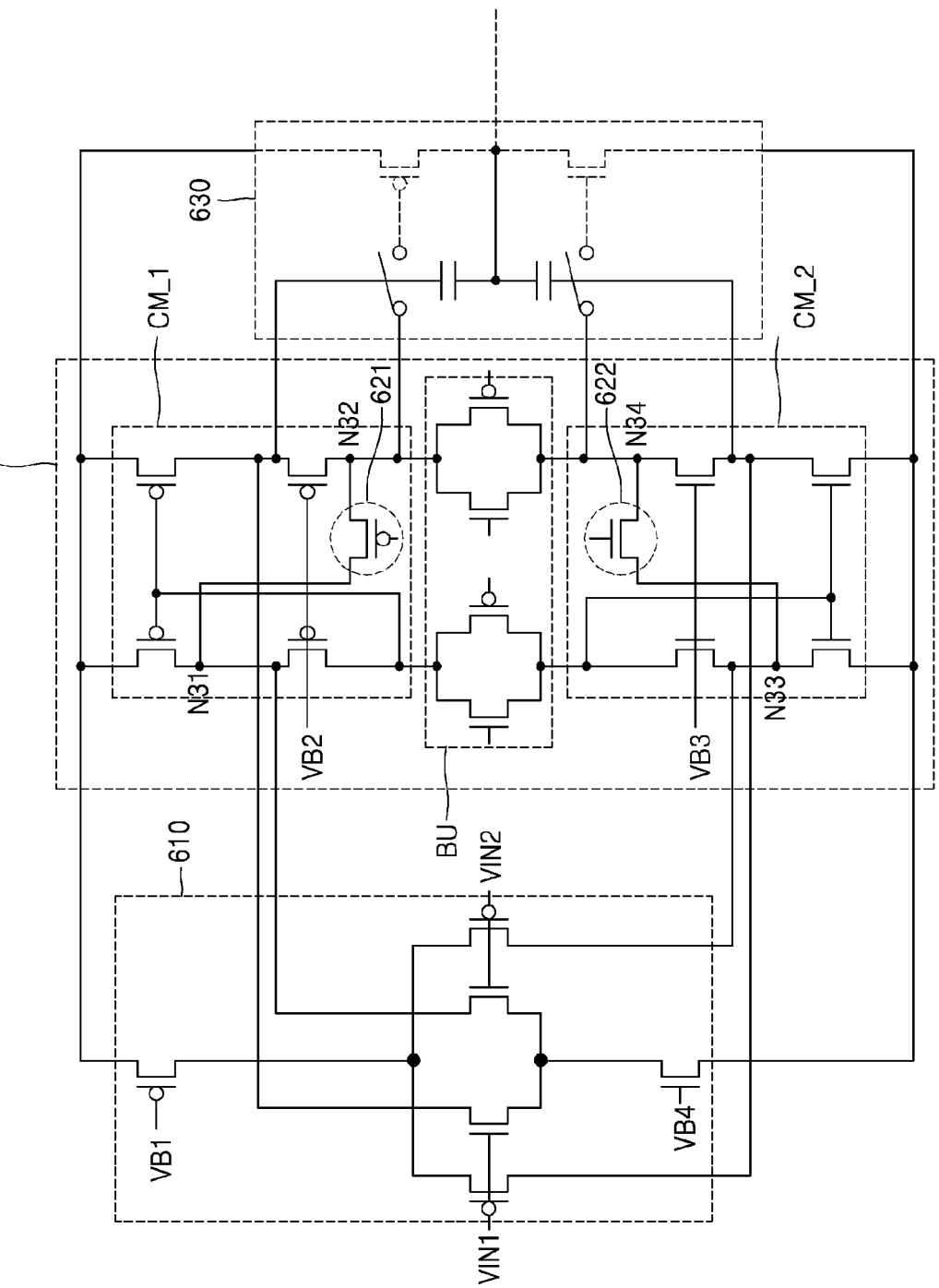
FIGS. 12, 13 and 14 are circuit diagrams of exemplary embodiments of an output buffer of source drivers according to exemplary embodiments.
Figure 13:
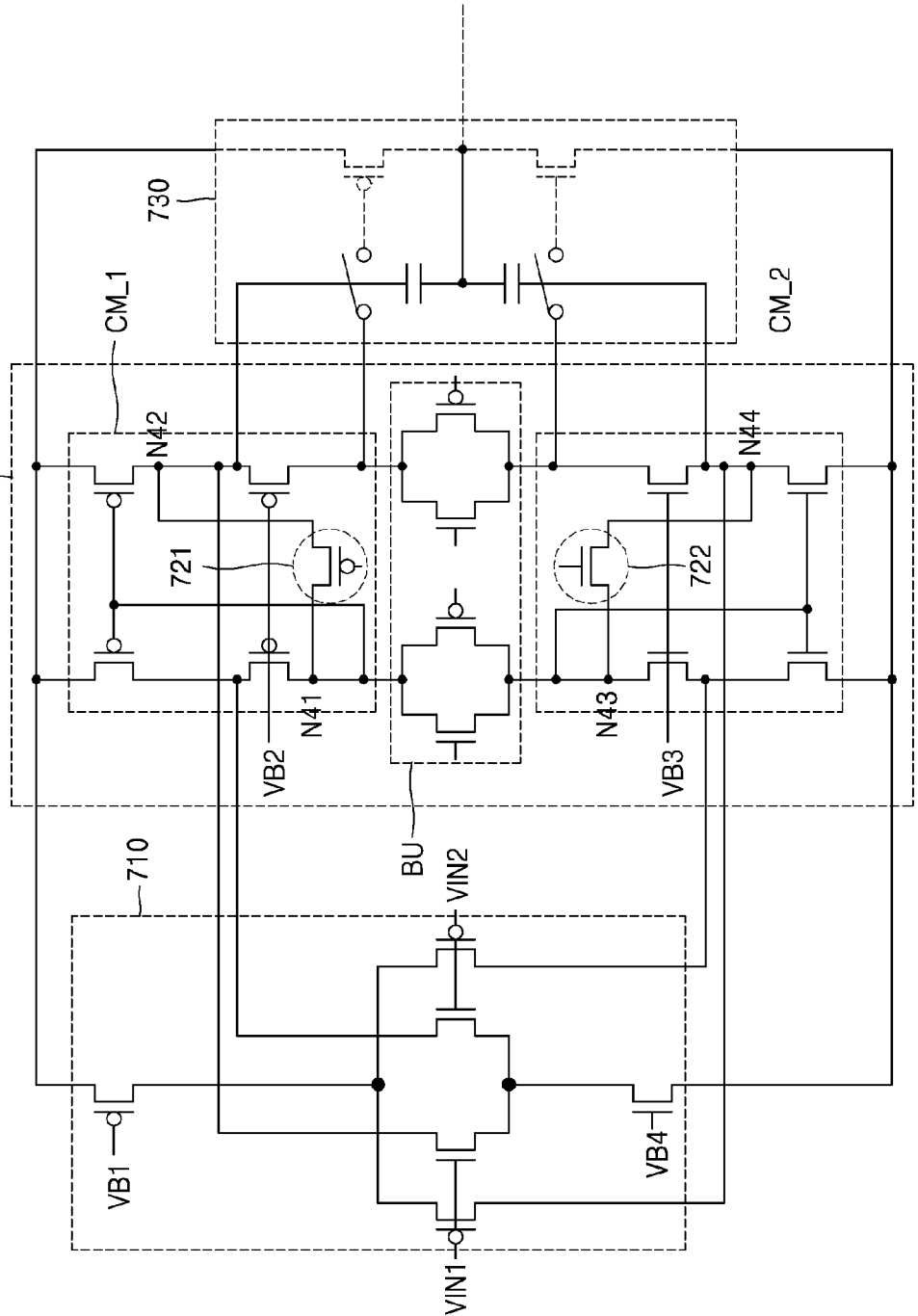
Figure 14:
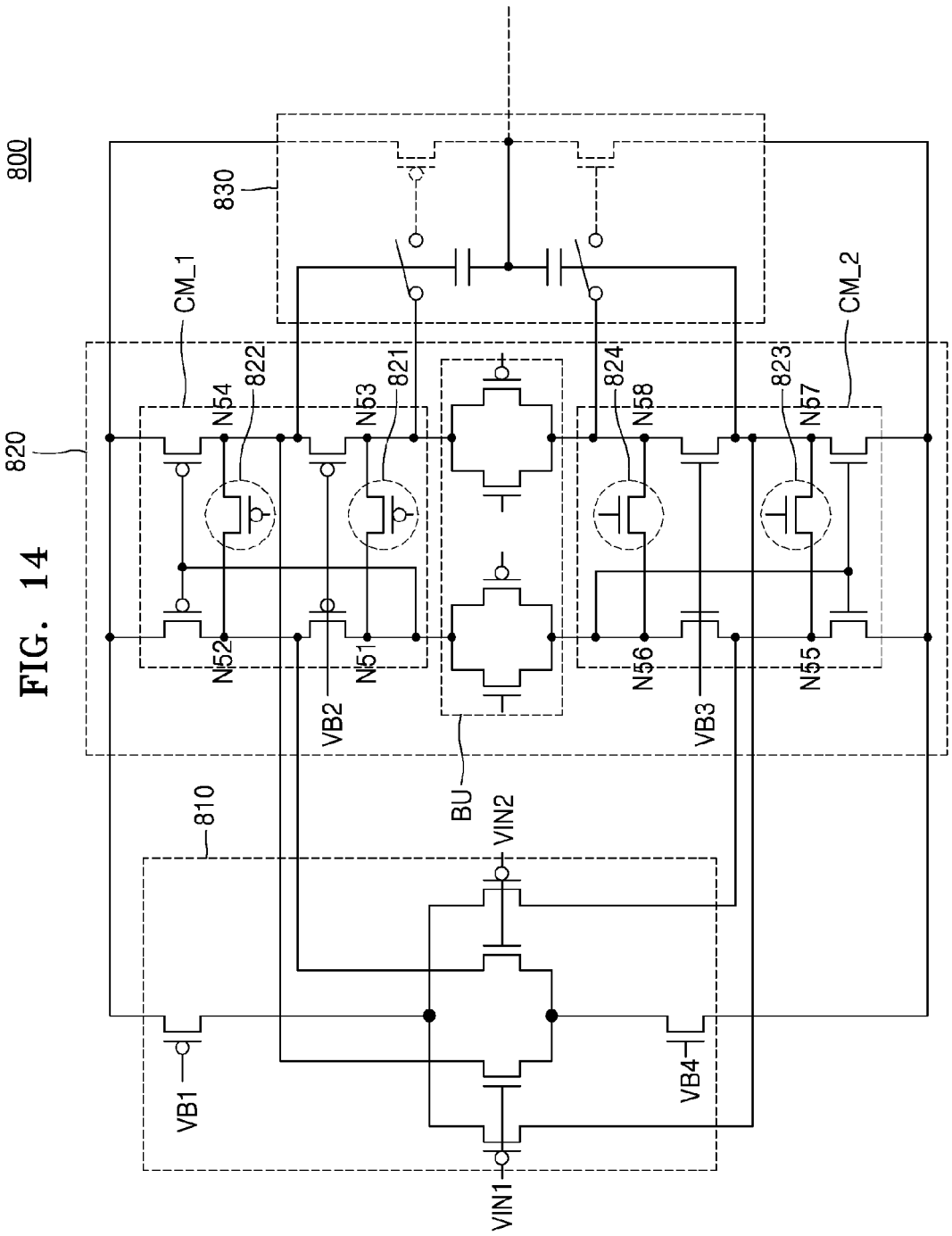

FIGS. 12, 13 and 14 are circuit diagrams of exemplary embodiments of an output buffer of source drivers according to exemplary embodiments. In describing structures and operations of buffers 600, 700, and 800 of FIGS. 12 through 14, the same components as those components shown in the above described circuit diagrams have the same operations as those components shown in the above described circuit diagrams, and thus, their detailed descriptions will be omitted.

As illustrated in FIG. 12, the buffer 600 may include an input unit 610 (e.g., inputter), an amplification unit 620 (e.g., amplifier), and an output driving unit 630 (e.g., output driver), and the amplification unit 620 may include a first current mirror CM_1, a bias unit BU, and a second current mirror CM_2. Also, during a charge sharing operation, the output driving unit 630 may be disabled.

The first current mirror CM_1 may include a reference current path and an output current path, and each of the reference current path and the output current path may include a plurality of nodes. For example, the reference current path may include a plurality of transistors connected in series to a power voltage and the bias unit BU. Also, the reference current path may include a first node N31, which is a node between the plurality of transistors. Similarly, the output current path may include a plurality of transistors connected in series to a power voltage and the bias unit BU. Also, the output current path may include a second node N32, which is a node connected to the bias unit BU.

Similarly, a reference current path of the second current mirror CM_2 may include a plurality of transistors connected in series to a ground voltage and the bias unit BU. Also, the reference current path of the second current mirror CM_2 may include a third node N33, which is a node between the plurality of transistors. Similarly, an output current path of the second current mirror CM_2 may include a plurality of transistors connected in series to a ground voltage and the bias unit BU. Also, the output current path may include a fourth node N34, which corresponds to a node connected to the bias unit BU.

In the exemplary embodiment of FIG. 12, for an electrical connection of various nodes of the buffer 600 during the charge sharing operation, a first connection switch 621 may be disposed between the first node N31 and the second node N32, and a second connection switch 622 may be disposed between the third node N33 and the fourth node N34. During the charge sharing operation, the first and second connection switches 621 and 622 are turned on, and thus, the first node N31 and the second node N32 may be electrically connected with each other, and the third node N33 and the fourth node N34 may be electrically connected with each other.

According to the exemplary embodiment illustrated in FIG. 13, the buffer 700 may include an input unit 710 (e.g., inputter), an amplification unit 720 (e.g., amplifier), and an output driving unit 730 (e.g., output driver), and the amplification unit 720 may include a first current mirror CM_1, a bias unit BU, and a second current mirror CM_2. Also, during a charge sharing operation, the output driving unit 730 may be disabled.

FIG. 13 illustrates an example of another connection of various nodes in the buffer 700 during the charge sharing operation. For example, the node of the reference current path of the first current mirror CM_1, the node being connected to the bias unit BU, may correspond to a first node N41, and the node of the output current path of the first current mirror CM_1, the node being between transistors, may correspond to a second node N42. The node of the reference current path of the second current mirror CM_2, the node being connected to the bias unit BU, may correspond to a third node N43, and the node of the output current path of the second current mirror CM_2, the node being between the transistors, may correspond to a fourth node N44.

A first connection switch 721 may be connected between the first node N41 and the second node N42, and a second connection switch 722 may be connected between the third node N43 and the fourth node N44. Also, during the charge sharing operation, the first connection switch 721 and the second connection switch 722 may be turned on.

FIG. 14 illustrates an example of another connection of various nodes in the buffer 800 during a charge sharing operation. For example, at least two connection switches are disposed in each current mirror. As illustrated in FIG. 14, the buffer 800 may include an input unit 810 (e.g., inputter), an amplification unit 820 (e.g., amplifier), and an output driving unit 830 (e.g., output driver), and the amplification unit 820 may include a first current mirror CM_1, a bias unit BU, and a second current mirror CM_2.

The first current mirror CM_1 may include a first node N51 and a second node N52 of a reference current path, and a third node N53 and a fourth node N54 of an output current path. Also, the second current mirror CM_2 may include a fifth node N55 and a sixth node N56 of a reference current path, and a seventh node N57 and an eight node N58 of an output current path. Also, according to an exemplary embodiment, a first connection switch 821 may be disposed between the first node N51 and the third node N53, and a second connection switch 822 may be disposed between the second node N52 and the fourth node N54. Also, a third connection switch 823 may be disposed between the fifth node N55 and the seventh node N57, and a fourth connection switch 824 may be disposed between the sixth node N56 and the eighth node N58. During the charge sharing operation, the first through fourth connection switches 821 through 824 may be turned on.

According to a modified version of the exemplary embodiment of FIG. 14, the first through fourth connection switches 821 through 824 may be disposed in various configurations other than the configuration shown in FIG. 14. For example, the first connection switch 821 may be disposed between the first node N51 and the fourth node N54, and the second connection switch 822 may be disposed between the second node N52 and the third node N53. Also, the third connection switch 823 may be disposed between the fifth node N55 and the eighth node N58, and the fourth connection switch 824 may be disposed between the sixth node N56 and the seventh node N57.

Figure 15:
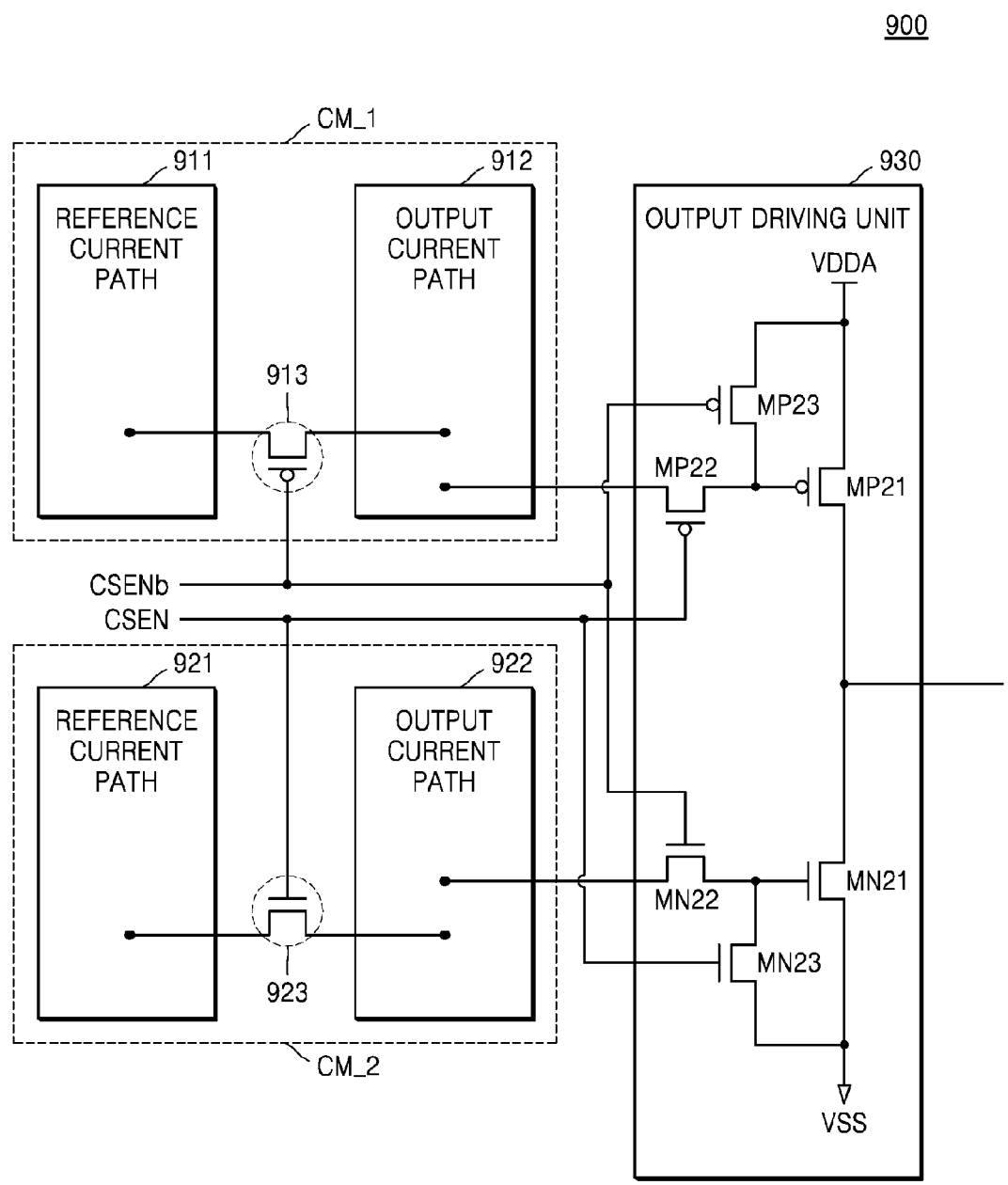
FIG. 15 is a block diagram of an example of a control signal for controlling transistors inside a buffer according to an exemplary embodiment.

FIG. 15 is a block diagram of an example of a control signal controlling transistors in a buffer 900, according to an exemplary embodiment.

As illustrated in FIG. 15, the buffer 900 may include a first current mirror CM_1 and a second current mirror CM_2 included in an amplification unit, and an output driving unit 930. The first current mirror CM_1 may include a reference current path 911, an output current path 912, and one or more connection switches 913. The second current mirror CM_2 may include a reference current path 921, an output current path 922, and one or more connection switches 923.

The output driving unit 930 may include a first driving transistor MP21, a second driving transistor MN21, a first enable switch MP22 connected to a gate of the first driving transistor MP21, and a second enable switch MN22 connected to a gate of the second driving transistor MN21. Also, according to an exemplary embodiment, the output driving unit 930 may include a first control switch MP23 for maintaining the gate of the first driving transistor as a level of a power voltage VDDA, and a second control switch MN23 for maintaining the gate of the second driving transistor MN21 as a level of a ground voltage VSS.

As a control signal for controlling the switches and the transistors included in the amplification unit and the output driving unit 930, a charge sharing enable signal CSEN (hereinafter, referred to as an enable signal) may be commonly used. For example, the enable signal CSEN and a complementary enable signal CSENb may be provided to the buffer 900, and during the charge sharing section, the enable signal CSEN may have a logic high value.

Accordingly, during the charge sharing section, the connections switch 913 may be turned on by the complementary enable signal CSENb, and the connection switch 923 may be turned on by the enable signal CSEN. Also, since the first enable switch MP22 is turned off by the enable signal CSEN, and the first control switch MP23 is turned on by the complementary enable signal CSENb, the gate of the first driving transistor MP21 may be maintained as the level of the power voltage VDDA.

Also, since during the charge sharing section, the second enable switch MN22 is turned off by the complementary enable signal CSENb, and the second control switch MN23 is turned on by the enable signal CSEN, the gate of the second driving transistor MN21 may be maintained at the level of the ground voltage VSS.

Figure 16:
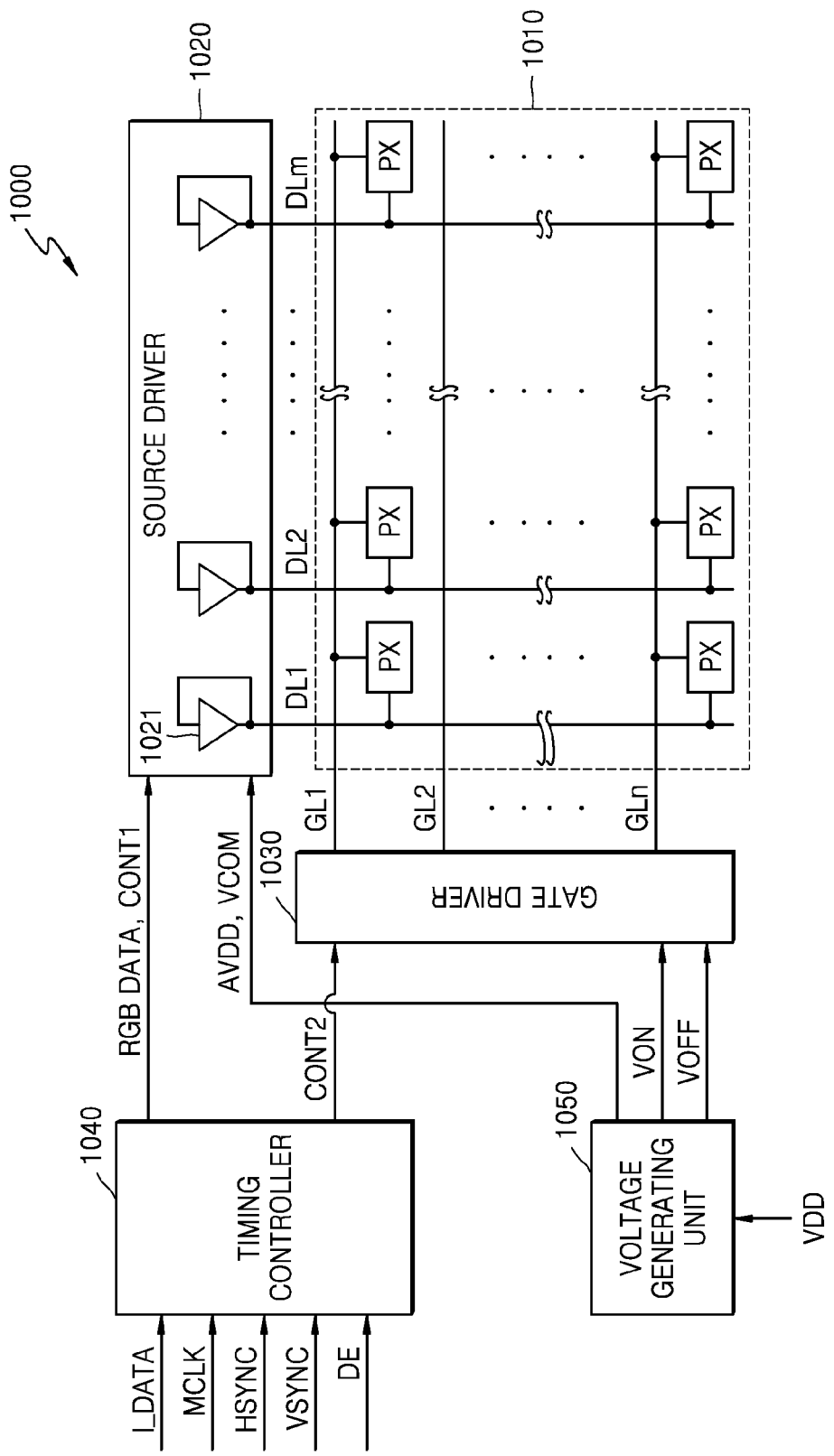
FIG. 16 is a block diagram of a structure of a display device according to an exemplary embodiment.

FIG. 16 is a block diagram of a structure of a display apparatus 1000 according to an exemplary embodiment. As illustrated in FIG. 16, the display apparatus 1000 includes a panel 1010 for displaying an image, and various peripheral devices for driving the panel 1010. As examples of the peripheral devices, the display apparatus 1000 may include a source driver 1020, a gate driver 1030, a timing controller 1040, and a voltage generating unit 1050. The devices for driving the panel 1010 may be defined as display driving circuits, and the display driving circuits may include at least one of the source driver 1020, the gate driver 1030, the timing controller 1040, and the voltage generating unit 1050.

The source driver 1020 may drive data lines DL1 through DLm of the panel 1010, and the gate driver 1030 may drive gate lines GL1 through GLn of the panel 1010. The timing controller 1040 may receive various signals. For example, the timing controller 1040 receives external data I_DATA, a horizontal synchronization signal H_SYNC, a vertical synchronization signal V_SYNC, a clock signal MCLK, and a data enable signal DE. Also, the timing controller 1040 may generate various timing signals for controlling the source driver 1020 and the gate driver 1030, or data RGB DATA, CONT1, and CONT2. The voltage generating unit 1050 may generate various voltages VON, VOFF, AVDD, and VCOM that are used to drive the display apparatus 1000.

The panel 1010 includes a plurality of pixels PX disposed in an area in which the gate lines GL1 through GLn and the data lines DL1 through DLm cross each other. When any one gate line is selected, a buffer unit of the source driver 1020 provides data signals to the data lines DL1 through DLm crossing the selected gate line.

The display apparatus 1000 according to the present exemplary embodiment includes the source driver 1020 including the output buffers according to the above described exemplary embodiments. Accordingly, the buffer of the source driver 1020 includes a feedback path (for example, a negative feedback path), and a connection switch 1021 is further disposed between various nodes in the buffer (for example, the amplification unit). Since, during a charge sharing operation, the connection switch 1021 is turned on, voltage levels of various nodes in the buffer are adjusted so that various nodes in the buffer may maintain a voltage level corresponding to a normal state, during the charge sharing section.

Figure 17:
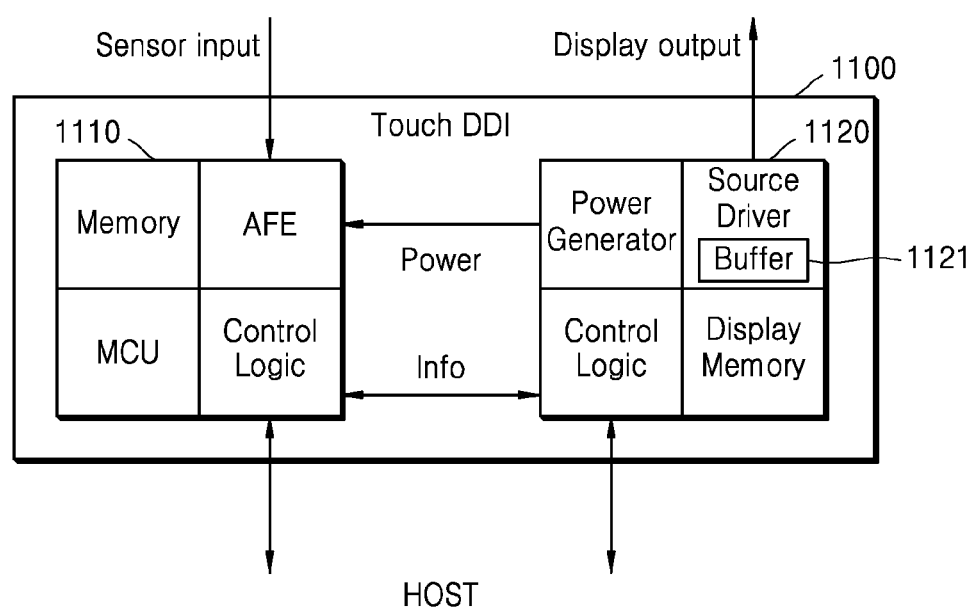
FIG. 17 is a block diagram of a touch display driving circuit according to an exemplary embodiment.

FIG. 17 is a block diagram of a touch display driving circuit 1100 according to an exemplary embodiment.

As illustrated in FIG. 17, the touch display driving circuit 1100 may be realized as one semiconductor chip, and thus, a display driving function for driving the panel and a touch control function for controlling a touch operation may be integrated into one semiconductor chip. For example, the touch display driving circuit 1100 may include a touch controlling unit 1110 (e.g., touch controller) and a display driving unit 1120 (e.g., display driver).

Since the touch controlling unit 1110 and the display driving unit 1120 are integrated into one semiconductor chip, the touch controlling unit 1110 and the display driving unit 1120 may exchange various types of information or signals via wirings in the semiconductor chip. For example, the touch controlling unit 1110 and the display driving unit 1120 each may provide state information indicating a state thereof. Also, the display driving unit 1120 may provide information indicating various timings related to the display driving, and the touch controlling unit 1110 may provide information indicating various timings related to the touch operation. Also, when a function block for generating power is included in the display driving unit 1120, the display driving unit 1120 may provide power to the touch controlling unit 1110. According to an exemplary embodiment, the provision of power of the display driving unit 1120 may be controlled based on various types of information exchanged between the display driving unit 1120 and the touch controlling unit 1110.

The touch controlling unit 1110 may include various function blocks which are respectively configured to perform predetermined functions. For example, the touch controlling unit 1110 may include an analog front end (AFE) that reads a signal of a sensing unit (e.g., sensor), a memory, a main control unit (MCU) (e.g., main controller), a control logic, etc. Also, the display driving unit 1120 may include a control logic, a display memory, a power generating unit, a source driver, etc. The source driver may include the buffer unit 1121 according to the exemplary embodiment. Buffers included in a buffer unit 1121 may include a feedback path (for example, a negative feedback path), and a connection switch is additionally disposed between various nodes in the buffer (for example, an amplification unit). During a charge sharing operation, the connection switch is turned on, and thus, voltage levels of various nodes in the buffer are adjusted so that various nodes in the buffer may maintain a voltage level corresponding to a normal state during the charge sharing operation.

While the exemplary embodiments have been particularly shown and described with reference to certain exemplary embodiments thereof, it will be understood that various changes in form and details may be made therein without departing from the spirit and scope of the following claims.

What is claimed is:

1. A source driver comprising:
 a buffer device comprising a plurality of buffers corresponding to a plurality of data lines, wherein each of the plurality of buffers respectively comprises an amplifier configured to amplify an input signal and an output driver configured to output a driving signal to a corresponding data line among the plurality of data lines; and a switch device comprising a charge sharing switch configured to electrically connect the plurality of data lines to one another during a charge sharing operation, wherein the amplifier of each of the plurality of buffers comprises a first current mirror having a first reference current path comprising a first node and a first output current path comprising a second node, wherein the first node of the first reference current path and the second node of the first output current path are electrically connected to each other during the charge sharing operation, wherein the amplifier further comprises a first switch connected between the first node and the second node, and wherein the first switch is turned on during the charge sharing operation.

2. The source driver of claim 1, further comprising a control logic configured to generate a first control signal for disabling the output driver and a second control signal configured to turn on the first switch during the charge sharing operation.

3. The source driver of claim 1, wherein the output driver is disabled during the charge sharing operation.

4. The source driver of claim 1, wherein the plurality of buffers are provided in a path which negatively feeds back the driving signal from an output end to an input end of the plurality of buffers.

5. The source driver of claim 4, wherein voltage levels of the first node and voltage levels of the second node during the charge sharing operation correspond to voltage levels of the plurality of buffers during a normal state.

6. The source driver of claim 1, wherein the amplifier further comprises a second current mirror having a second reference current path comprising a third node and a second output current path comprising a fourth node, and
in the second current mirror, the third node of the second reference current path and the fourth node of the second output current path are electrically connected to each other during the charge sharing operation.

7. The source driver of claim 1, wherein the amplifier further comprises a bias device,
the first reference current path comprises a first transistor comprising a first gate and a second transistor comprising a second gate, the first transistor and the second transistor being connected in series to each other between a first voltage and the bias device,
the first output current path comprises a third transistor comprising a third gate and a fourth transistor comprising a fourth gate, the third transistor and the fourth transistor being connected in series to each other between the first voltage and the bias device, and
the first gate of the first transistor is connected to the third gate of the third transistor, and the second gate of the second transistor is connected to the fourth gate of the fourth transistor.

8. The source driver of claim 7, wherein the first node is provided between the first transistor and the second transistor, and the second node is provided between the third transistor and the fourth transistor.

9. The source driver of claim 7, wherein the first node is provided between the second transistor and the bias device, and the second node is provided between the fourth transistor and the bias device.

10. The source driver of claim 7, wherein the first node is provided between the first transistor and the second transistor or between the second transistor and the bias device, and the second node is provided between the third transistor and the fourth transistor or between the fourth transistor and the bias device.

11. A source driver comprising:
a plurality of buffers, each of the plurality of buffers respectively comprising an amplifier configured to amplify an input signal and an output driver configured to output a driving signal to a data line,
wherein the amplifier comprises a bias device configured to receive a bias voltage and a first current mirror connected between a first voltage and the bias device, and
the first current mirror comprises:
a first transistor and a second transistor forming a first reference current path and connected in series to each other between the first voltage and the bias device,
a third transistor and a fourth transistor forming a first output current path and connected in series to each other between the first voltage and the bias device, and
a first switch electrically connecting the first reference current path to the first output current path.

12. The source driver of claim 11, wherein the first reference current path comprises:
a first node provided between the first transistor and the second transistor, and
a second node provided between the second transistor and the bias device, and
the first output current path comprises a third node provided between the third transistor and the fourth transistor and a fourth node provided between the fourth transistor and the bias device.

13. The source driver of claim 12, wherein the first switch comprises a first electrode connected to the first node or the second node, and further comprises a second electrode connected to the third node or the fourth node.

14. The source driver of claim 12, wherein the first current mirror further comprises a second switch electrically connecting the first reference current path to the first output current path,
the first switch is connected between one of the first node and the second node and one of the third node and the fourth node, and
the second switch is connected between the other of the first node and the second node and the other of the third node and the fourth node.

15. The source driver of claim 11, wherein the amplifier further comprises a second current mirror connected between a second voltage and the bias device, and
the second current mirror comprises:
a fifth transistor and a sixth transistor forming a second reference current path and connected in series to each other between the second voltage and the bias device,
a seventh transistor and an eighth transistor forming a second output current path and connected in series to each other between the second voltage and the bias device, and
a second switch electrically connecting the second reference current path to the second output current path.

16. The source driver of claim 15, wherein the first voltage is a power voltage and the second voltage is a ground voltage.

17. The source driver of claim 15, wherein the second reference current path comprises a fifth node provided between the fifth transistor and the sixth transistor and a sixth node provided between the sixth transistor and the bias device, and the second output current path comprises a seventh node provided between the seventh transistor and the eighth transistor and an eighth node provided between the eighth transistor and the bias device.

18. The source driver of claim 17, wherein the output driver comprises:

a first driving transistor comprising a gate connected to a fourth node, a second driving transistor comprising a gate connected to the eighth node, a first compensation capacitor comprising an electrode connected to a third node;

a second compensation capacitor comprising an electrode connected to the seventh node, a first enable switch connected between the fourth node and the gate of the first driving transistor, and a second enable switch connected between the eighth node and the gate of the second driving transistor.

19. An output buffer of a source driver having a feedback path, the output buffer comprising:

an inputter configured to receive a gradation voltage and a feedback voltage as input signals;

an amplifier configured to perform an amplification operation based on the input signals and thereby generate an output signal, the amplifier comprising a first current mirror connected to a first voltage, a second current mirror connected to a second voltage, and a bias device connected between the first current mirror and the second current mirror, the first current mirror comprising at least two nodes provided inside the first current mirror; and an output driver configured to generate a driving signal for driving a data line, based on the output signal of the amplifier, wherein the first current mirror comprises a first switch configured to electrically connect the at least two nodes provided inside the first current mirror to each other during a charge sharing operation.

* * * * *